(12) United States Patent
Nozaki et al.

(10) Patent No.: US 9,949,371 B2
(45) Date of Patent: Apr. 17, 2018

(54) RESIN COMPOSITE ELECTROLYTIC COPPER FOIL, COPPER CLAD LAMINATE AND PRINTED WIRING BOARD

(71) Applicants: MITSUBISHI GAS CHEMICAL COMPANY, INC., Tokyo (JP); PI R&D CO., LTD., Kanagawa (JP)

(72) Inventors: Mitsuru Nozaki, Tokyo (JP); Akihiro Nomoto, Tokyo (JP); Norikatsu Akiyama, Tokyo (JP); Eiji Nagata, Kanagawa (JP); Masashi Yano, Kanagawa (JP)

(73) Assignees: MITSUBISHI GAS CHEMICAL COMPANY, INC., Tokyo (JP); PI R&D CO., LTD., Kanagawa (JP)

( * ) Notice: Subject to any disclaimer, the term of this patent is extended or adjusted under 35 U.S.C. 154(b) by 0 days.

(21) Appl. No.: 15/241,749

(22) Filed: Aug. 19, 2016

(65) Prior Publication Data

US 2016/0360615 A1    Dec. 8, 2016

Related U.S. Application Data

(63) Continuation of application No. 13/386,751, filed as application No. PCT/JP2010/061291 on Jun. 25, 2010.

(30) Foreign Application Priority Data

Jul. 24, 2009    (JP) ................................ 2009-173448

(51) Int. Cl.
*H05K 1/09* (2006.01)
*B32B 15/08* (2006.01)
(Continued)

(52) U.S. Cl.
CPC ............... *H05K 1/09* (2013.01); *B32B 15/08* (2013.01); *C25D 1/04* (2013.01); *C25D 7/0614* (2013.01);
(Continued)

(58) Field of Classification Search
CPC ........ H05K 1/09; H05K 1/0346; H05K 3/384; H05K 2201/0154; H05K 2201/0355;
(Continued)

(56) References Cited

U.S. PATENT DOCUMENTS 4,661,417 A    4/1987 Yoshihiro et al.
4,867,839 A    9/1989 Sato et al.
(Continued)

FOREIGN PATENT DOCUMENTS

CN    1657279    8/2005
JP    61-94756    5/1986
(Continued)

OTHER PUBLICATIONS

Giesche, Herbert "Mercury Porosimetry: a General (Practical) Overview" Part. Part. Syst. Charact. 23 (2006) 1-11.
(Continued)

*Primary Examiner* — Kevin R Kruer
(74) *Attorney, Agent, or Firm* — Greenblum & Bernstein, P.L.C.

(57) ABSTRACT

The problem of the invention is to provide a resin composite electrolytic copper foil having further improved heat resistance and improved plate adhesion strength when plated after desmear treatment in the work process of an additive method. The solution is to form a roughened surface having a plurality of minute projections, a surface roughness (Rz) within a range of 1.0 pm to 3.0 pm and a lightness value of not more than 30 on one surface of an electrolytic copper foil (A), and form a layer of a resin composition (B) containing
(Continued)

a block copolymerized polyimide resin (a) having a structure that imide oligomers of a first structural unit and a second structural unit are bonded alternately and repeatedly on the roughened surface.

20 Claims, 5 Drawing Sheets

(51) Int. Cl.
*C25D 1/04* (2006.01)
*C25D 7/06* (2006.01)
*H05K 1/03* (2006.01)
*H05K 3/38* (2006.01)
*H05K 3/46* (2006.01)
*C25D 5/02* (2006.01)

(52) U.S. Cl.
CPC ......... *C25D 7/0678* (2013.01); *H05K 1/0346* (2013.01); *H05K 1/0373* (2013.01); *H05K 3/384* (2013.01); *H05K 3/4652* (2013.01); *C25D 5/022* (2013.01); *H05K 2201/0154* (2013.01); *H05K 2201/0355* (2013.01); *H05K 2201/0358* (2013.01); *H05K 2203/0307* (2013.01); *Y10T 428/31681* (2015.04)

(58) Field of Classification Search
CPC ... H05K 2201/0358; H05K 2203/0307; H05K 1/0373; H05K 3/4652; B32B 15/08; C25D 5/022; C25D 7/0678; C25D 1/04; C25D 7/0614
See application file for complete search history.

(56) References Cited

U.S. PATENT DOCUMENTS

| 2002/0038790 | A1 | 4/2002 | Kurii et al. |
| 2005/0175826 | A1 | 8/2005 | Suzuki |
| 2006/0054589 | A1 | 3/2006 | Omori et al. |
| 2006/0088723 | A1 | 4/2006 | Suzuki |
| 2007/0172674 | A1 | 7/2007 | Nozaki et al. |
| 2008/0182112 | A1 | 7/2008 | Kaneshiro et al. |
| 2008/0261020 | A1 | 10/2008 | Kawaguchi et al. |

FOREIGN PATENT DOCUMENTS

| JP | 8-216340 | 8/1996 |
| JP | 9-11397 | 1/1997 |
| JP | 2003-304068 | 10/2003 |
| JP | 2004-289053 | 10/2004 |
| JP | 2005-248323 | 9/2005 |
| JP | 2006-103189 | 4/2006 |
| JP | 2007-281361 | 10/2007 |
| JP | 2008-188778 | 8/2008 |
| JP | 2008-254352 | 10/2008 |

OTHER PUBLICATIONS

Chinese Office action dated Apr. 7, 2015 with English translation thereof.
Taiwan Office action in corresponding Taiwanese application, dated Aug. 29, 2014 along with an English translation thereof.
China Office action in CN 201080042570.7, dated Nov. 17, 2014 along with an English translation thereof.
China Office action in CN 201080042570.7, dated May 30, 2014 along with an english translation thereof.
Japan Office action in JP 2011-523597, dated Jun. 24, 2014 along with an English translation thereof.
China Office action, dated Dec. 3, 2013 along with an english translation thereof.
Search report from International Patent Application No. PCT/JP2010/061291, dated Aug. 3, 2010.
Extended European Search Report in respect to European Application No. 10802160.1, dated Oct. 21, 2014.
Yonehara et al., "Experimental Relationships between Surface Roughness, Glossiness and Color of Chromatic Colored Metals"; Materials Transactions, vol. 45, No. 4; Jan. 1, 2004; pp. 1027-1032.
Giesche, "Mercury Prosimetry: A General (Practical) Overview"; Particle & Particle Systems Characterization, vol. 23, No. 1; Jun. 1, 2006; pp. 9-19.
European Office Action issued in Patent Application No. 10802160.1, dated Apr. 20, 2017.

RESIN COMPOSITE ELECTROLYTIC COPPER FOIL, COPPER CLAD LAMINATE AND PRINTED WIRING BOARD

CROSS-REFERENCE TO RELATED APPLICATIONS

The present application is a Continuation of U.S. application Ser. No. 13/386,751, which is a national stage of International Application No. PCT/JP2010/061291, filed Jun. 25, 2010, which claims priority of JP 2009-173448, filed Jul. 24, 2009. The entire disclosures of U.S. application Ser. No. 13/386,751 and PCT/JP2010/061291 are expressly incorporated by reference herein.

BACKGROUND OF THE INVENTION

1. Field of the Invention

This invention relates to a resin composite electrolytic copper foil used in producing a printed wiring board, a copper clad laminate having the resin composite electrolytic copper foil and a B-stage resin composition layer laminate molded, a printed wiring board using the copper clad laminate, and a method for producing the printed wiring board. More specifically, it relates to a resin composite electrolytic copper foil having a copper foil with very small unevenness on a copper foil matt surface applied and being excellent in adhesion strength to a resin composition, a copper clad laminate using the resin composite electrolytic copper foil and having good heat resistance, and a high density printed wiring board using the copper clad laminate and capable of forming a fine circuit.

2. Description of the Related Art

In recent years, in order to mount an electronic component such as a semiconductor part for use in an electronic device, a printed wiring board has been demanded to further ultra-thin its circuit conductor width and insulating space between circuits, in combination with ultrahigh densification of a semiconductor circuit. Also, a solder upon mounting is, since it is lead free for environmental responsiveness and the mounting temperature becomes high, required to have further heat resistance.

Conventionally, as a copper foil of a copper clad laminate for use in a printed wiring board, an electrolytic copper foil having remarkable unevenness on a copper foil matt surface and good copper foil adhesion strength to a resin has been used. Although these electrolytic copper foils have good adhesion strength, there are problems such that when forming a fine circuit by an etching method, a part of a convex portion of the copper foil is liable to remain on an insulating resin surface due to influence of the unevenness on the copper foil matt surface, that as the etching time is extended in order to completely remove this, the circuit is over-etched, deteriorating location accuracy of the circuit and adhesion strength, and the like. As a means for mending these problems, a so-called low profile copper foil having suppressed unevenness on a copper foil surface has been put to practical use. However, when this copper foil is applied to a copper clad laminate with a highly heat resistant thermosetting resin and the like having essentially weak adhesion strength, lack of adhesion strength becomes a problem in a fine circuit, which has been an obstacle to ultrathinning.

Also from several years ago, in order to improve the adhesion strength between a copper foil and an insulating resin, a method of forming an insulating adhesive layer on a copper foil has come into practical use. For example, in the case of a paper phenol resin copper clad laminate, a method of forming an adhesive layer of phenol butyral resin on a copper foil, in the case of a glass epoxy resin copper clad laminate, a method of forming an epoxy resin adhesive on a copper foil, and the like are known. As specific examples of these resin composite copper foils, a copper clad laminate using a copper foil having a thin adhesive layer formed (e.g. see Japanese Patent Application Laid-open Publication No. H8-216340), a copper clad laminate using a copper foil having a semi-set resin film bonded (e.g. see Japanese Patent Application Laid-open Publication No. H9-011397) and the like have been suggested. However, these resin composite copper foils and copper clad laminates using a copper foil having a semi-set resin film bonded have problems in heat resistance, adhesiveness and heat resistance under moisture absorption, and have required further improvement.

Recently, a surface treated copper foil having particles attached to a surface of a copper foil for improving adhesiveness (see Japanese Patent Application Laid-open Publication No. 2005-248323) has been suggested. However, in a laminate having this surface treated copper foil laminated with an insulating heat resistant thermosetting resin, a fine circuit by an additive method could not be applied to a high density printed wiring board due to the problem of lacking the adhesion, strength of plated copper. Moreover, although a resin composite electrolytic copper foil having a resin composition layer (B) comprising a block copolymerized polyimide resin (a) and 2,2-bis[4-(4-maleimidephenoxy)phenyl]propane (b) formed (Japanese Patent Application Laid-open Publication No. 2008-254352) has been suggested in order to solve this problem, when desmear treatment is conducted in the work process of the additive method, the plate adhesion strength was insufficient. In addition, with the introduction of an environmental responsive lead free solder containing no lead, further high heat resistance is demanded for dealing with a lead free solder process conducted at a temperature higher than before, and improvement has been required.

SUMMARY OF THE INVENTION

The subject of the invention is to provide a copper clad laminate, a printed wiring board and a resin composite copper foil for use in producing the printed wiring board, to provide a resin composite electrolytic copper foil having further improved heat resistance and improved plate adhesion strength when plated after desmear treatment in the work process of an additive method, and to further allow formation of a fine circuit of a printed wiring board by using the resin composite electrolytic copper foil.

The inventors have, as a result of a keen examination for solving the above problems, found that by using a resin composite electrolytic copper foil having a layer of particular resin composition formed on one surface of a particular electrolytic copper foil, a copper clad laminate suitable for mass production and excellent in adhesion strength and heat resistance can be obtained due to a synergistic effect of the surface shape of the copper foil and the resin composition, and reached at the invention.

Thus, the summary of the invention is as follows.

(1) A resin composite electrolytic copper foil prepared by forming a roughened surface having a plurality of minute projections, a surface roughness (Rz) within a range of 1.0 μm to 3.0 μm and a lightness value of not more than 30 on one surface of an electrolytic copper foil (A), and forming a layer of a resin composition (B) containing a block copolymerized polyimide resin (a) having a structure that imide oligomers of a first structural unit and a second structural unit are bonded alternately and repeatedly on the roughened surface.

(2) A resin composite electrolytic copper foil according to the above item (1), wherein in the roughened surface, the volume of a pore with a pore diameter of 100 to 1000 nm is not less than 0.1 mL/m².

(3) A resin composite electrolytic copper foil according to the above item (1), wherein the minute projection has a plurality of bored portions on the lateral when seen in the cross sectional surface along the thickness direction of the electrolytic copper foil.

(4) A resin composite electrolytic copper foil according to the above item (1), wherein the minute projections are located by 200 to 25000 in an area of 100 μm×100 μm.

(5) A resin composite electrolytic copper foil according to the above item (1), wherein the weight average molecular weights of the imide oligomers as the first and the second structural units in the block copolymerized polyimide resin (a) are each independently 5000 to 30000.

(6) A resin composite electrolytic copper foil according to the above item (1), wherein the block copolymerized polyimide resin (a) is a block copolymerized polyimide resin (a) having a block of the general formula (1) as a structural unit and a block of the general formula (2) as a structural unit.

[Chemical Formula 1]

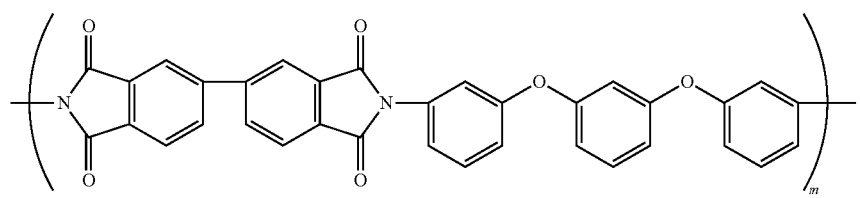

(1)

[Chemical Formula 2]

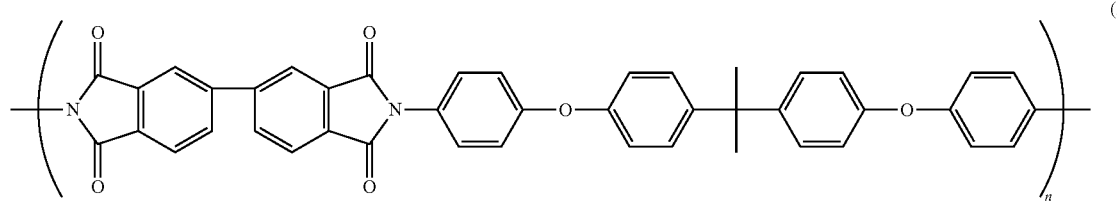

(2)

(In the formulae, m and n are each not less than 2, and m:n=1:9 to 3:1)

(7) A resin composite electrolytic copper foil according to the above item (1), wherein the resin composition (B) contains an inorganic filler (b).

(8) A resin composite electrolytic copper foil according to the above item (7), wherein the resin composition (B) contains the inorganic filler (b) within a range of 5 to 50% by volume based on total 100% by volume of the block copolymerized polyimide resin (a) and the inorganic filler (b).

(9) A resin composite electrolytic copper foil according to the above item (1), wherein the resin composition (B) contains a maleimide compound (c).

(10) A resin composite electrolytic copper foil according to the above item (9), wherein in the resin composition (B), the content of the block copolymerized polyimide resin (a) and the maleimide compound (c) is 1:9 to 9:1 in the weight ratio.

(11) A resin composite electrolytic copper foil according to the above item (9), wherein the maleimide compound (c) is 2,2-bis[4-(4-maleimidephenoxy)phenyl]propane.

(12) A resin composite electrolytic copper foil according to the above item (1), wherein the thickness of the layer of the resin composition (B) is 1 μm to 10 μm.

(13) A copper clad laminate prepared by layer laminating a resin composite electrolytic copper foil according to any of the above items (1) to (12) and a B-stage resin composition layer.

(14) A copper clad laminate according to the above item (13), wherein the B-stage resin composition layer contains a resin and an inorganic filler, and contains the inorganic filler within a range of 5 to 50% by volume based on total 100% by volume of the resin and the inorganic filler.

(15) A copper clad laminate prepared by forming a copper layer with plating on a surface of a copper clad laminate according to the above item (13) or (14) where copper is entirely removed.

(16) A printed wiring board using a copper clad laminate according to any of the above items (13) to (15).

A resin composite electrolytic copper foil obtained in the invention can, since the adhesion strength of a copper clad laminate to a resin composition is excellent, have an electrolytic copper foil with small unevenness on a copper foil matt surface, roughened by attaching roughening particles, applied, and by using this resin composite electrolytic copper foil, a copper clad laminate with good economic efficiency and heat resistance under moisture absorption can be obtained. Since this copper clad laminate can be preferably used as a high density printed wiring board with a fine circuit, is particularly excellent in the adhesion strength of plated copper after desmear treatment and have further improved heat resistance, industrial practicality of the resin composite electrolytic copper foil of the invention is extremely high.

BRIEF DESCRIPTION OP THE DRAWINGS

The invention will be described with reference to the accompanying drawings, wherein.

DESCRIPTION OF THE PREFERRED EMBODIMENTS

An electrolytic copper foil used in the invention can be obtained by conducting electrolytic treatment using a plating solution for surface roughening treatment and the like. The surface roughness Rz of the electrolytic copper foil is required to be within a range of 1.0 to 3.0 µm. The one with an Rz of less than 1.0 µm cannot achieve the subject of the invention due to low peel strength, and also the one with an Rz of more than 3.0 µm is inadequate in terms of high frequency property and fine patterning.

Moreover, an electrolytic copper foil in the invention is required to have a lightness value of not more than 30. The lightness in the invention is a lightness usually used as an index showing surface roughness, and the measurement method thereof is a method of irradiating a measurement sample surface and measuring the light reflection amount to be represented as a lightness value. As the lightness of a treated surface of an electrolytic copper foil is measured by this method, the tendency is that when the Rz as surface roughness is large or a groove between roughening particles is deep, the light reflection amount becomes small so the lightness value becomes low, and when the surface is flat and smooth, the light reflection amount becomes large so the lightness becomes high. In order to improve the peel strength with a polyimide resin in the invention, the lightness should be not more than 30.

Here, regarding the lightness measurement, the lightness was measured with a light meter (made by Suga Test Instruments Co., Ltd., model name: SM Color Computer, model number: SM-4) after conducting anti-rust treatment within a range of Ni: 0.01 to 0.5 mg/dm²
Zn: 0.01 to 0.5 mg/dm²
Cr: 0.01 to 0.3 mg/dm² to a copper foil to be measured.

In the invention, for the purpose of obtaining excellent peel strength and fine patterning property, the electrolytic copper foil has a plurality of minute projections on one surface. Although the minute projection is not limited to particular conditions as long as it meets the above ranges for the surface roughness and the lightness of the roughened surface of the electrolytic copper foil, its shape is, when seen in the cross sectional surface along the thickness direction of the electrolytic copper foil, preferable to have a plurality of bored portions on a side surface from the perspective that more excellent peel strength can be obtained by the synergistic effect with a layer of resin composition to be described below.

Figure 2:
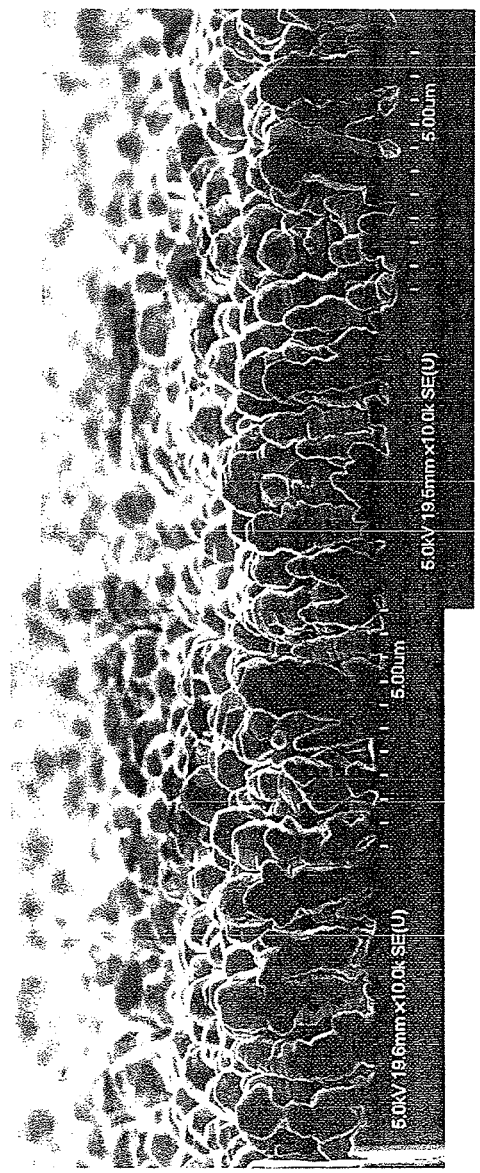
FIG. 2 is an enlarged photo showing a cross sectional surface of an electrolytic copper foil of the invention.
Figure 5:
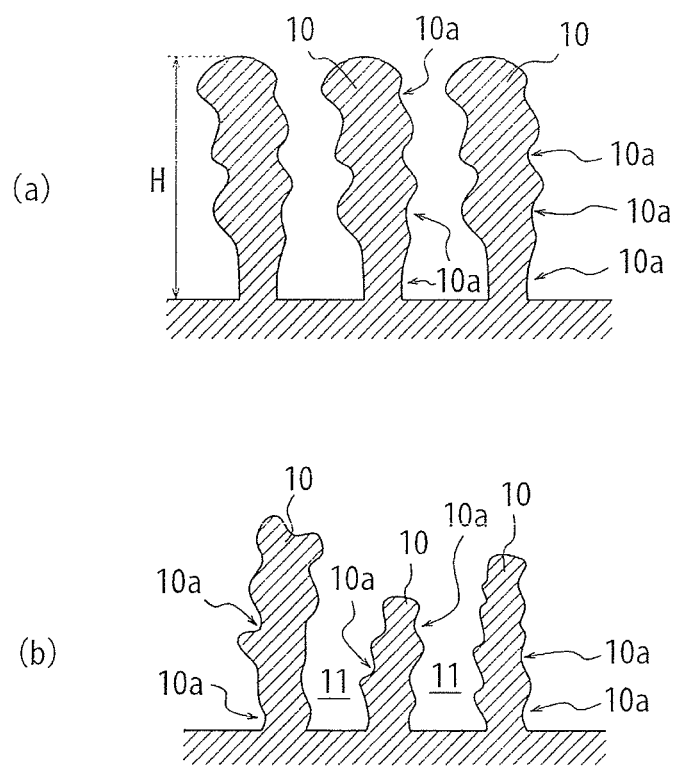
FIG. 5 is a schematic cross section view of an electrolytic copper foil of the invention.

Here, FIG. 2 is an enlarged photo showing a cross sectional surface of an electrolytic copper foil of the invention, and FIGS. 5 (a) and (b) is a view schematically showing a cross sectional surface of an electrolytic copper foil of the invention. The bored portion of the minute projections is, as shown in FIG. 5 (a), a portion 10a bored inward in the width direction among side surfaces of the minute projection 10. Since difference in diameter is generated between the upper end and the root portion of a minute projection by forming the bored portion 10a, high anchor effect with a resin composition formed on the electrolytic copper foil is exerted, resulting in improvement of peel strength. The way of being bored of the bored portion 10a is not particularly limited as long as it is bored inward in the width direction of the minute projection when seen in a cross sectional surface along the thickness direction of the electrolytic copper foil, and as shown in FIGS. 5 (a) and (b), it is possible to have bored portions 10a with various shapes. In addition, from the actual photo shown in FIG. 2, it is also clear that the minute projection has a plurality of bored portions.

Figure 6:
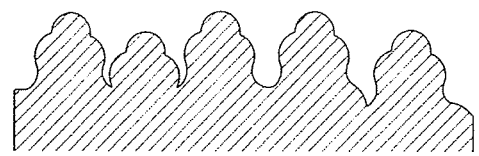
FIG. 6 is a schematic cross section view of a conventional electrolytic copper foil.

On the other hand, as shown in FIG. 6, it is clear that a cross sectional surface of a conventional electrolytic copper foil is greatly different in shape from an electrolytic copper foil of the invention with minute projections 10 having bored portions 10a. This can also be seen by comparing an enlarged photo showing a cross sectional surface of a conventional electrolytic copper foil shown in FIG. 4 and a photo of a cross sectional surface of an electrolytic copper foil of the invention shown in FIG. 2.

Moreover, the height of the minute projection is preferable to be 1.0 µm to 5.0 µm. It is because the effect of increasing peel strength cannot be obtained with a height of less than 1.0 µm, while variation in Rz increases, peel strength cannot be kept stable, high frequency property decreases, and it is liable to be unsuitable for fine patterning with a height of more than 5.0 µm. It should be noted that the height described herein refers to, as shown in FIG. 5 (a), a distance H between a surface of a portion without the minute projection and a vertex of the minute projection 10 in a copper foil.

Furthermore, in the roughened surface of the electrolytic copper foil, the volume of pores with a diameter of 100 to 1000 nm is preferable to be not less than 0.1 mL/m² from the point of obtaining more excellent peel strength. When the volume of pores is less than 0.1 mL/m², the volume of pores is too small and the amount of the resin composition (B) entering into the pores becomes small, which could lead to the problem that sufficiently desirable peel strength cannot be ensured. Here, the pore refers to, as shown in FIG. 5 (b), a portion where a minute projection is not formed, which becomes as a result of that the minute projections are formed on a surface of a copper foil.

Figure 1:
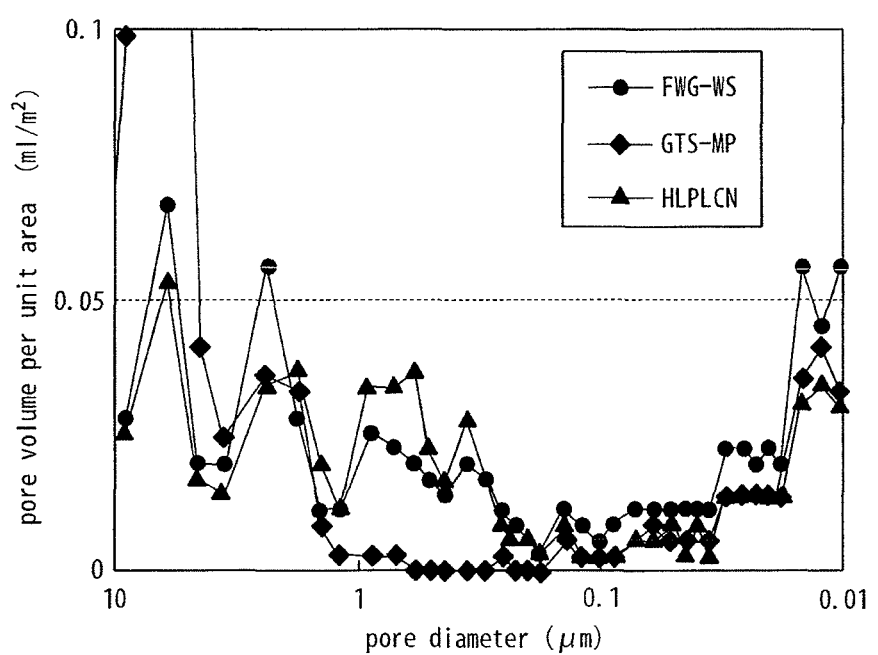
FIG. 1 is a graph showing the relationship between the pore diameter (μm) of a pore formed on a roughened surface of an electrolytic copper foil and the pore volume per unit area (ml/m²) of an electrolytic copper foil with a plurality of minute projections.

Here, FIG. 1 is a graph showing the relationship between the pore diameter (nm) of the pores and the pore volume per unit area (mL/m²). From FIG. 1, it is clear that in a roughened surface of a copper foil of the invention, the volume of pores with a pore diameter of 100 to 1000 nm is not less than 0.01 mL/m2, which is larger than a roughened surface of a conventional copper foil.

In addition, a method for measuring the above pore volume is not particularly limited as long as it is a method capable of certainly measuring the volume of pores with a pore diameter of 100 to 1000 nm. For example, it can be measured with an instrument: Shimadzu Autopore III 9400 series (made by Shimadzu Corporation).

Moreover, regarding the number of minute projections, desired peel strength cannot be exerted with few, while the effect decreases conversely even with many due to weak adhesiveness between a copper foil surface and minute projections. The number of minute projections on a copper foil surface in the invention is preferable to be 200 to 25000 present in an area of 100 µm×100 µm. When the number of minute projections is less (less than 200), space between minute projections becomes wide and fine patterning is liable to be impossible, and when it is more than 25000, distance between minute projections becomes narrow and the peel strength is liable to deteriorate.

Additionally, in the invention, the number of the minute projections is preferably 6 to 35, in particular most preferably 10 to 20 present in the observation field width of a cross sectional surface of 25 µm.

Furthermore, by substantially evenly distributing 6 to 35 minute projections with a height of 1.0 µm to 5.0 µm present within the observation field width of a cross sectional surface of 25 µm for forming grooves with a depth of not less than 0.3 µm, it can be avoided to have minute projections partially focused within 25 µm and the peel strength can be stabilized in the width direction/longitudinal direction of a copper foil. It should be noted that "substantially evenly distributed" refers to, for example, the case in which when the number of minute projections with the height between the vertex of the minute projection and the copper foil surface of 1.0 to 5.0 µm is n and the observation width when minute projections are observed in a cross sectional surface is 25 (µm), one portion of at least one of the minute projections exists in an area with the width of 25/n (µm).

In addition, roughening particles for forming the minute projections are not particularly limited to any conditions other than that the main component is Cu. For example, Cu or alloy particles of Cu and Mo, or ones containing Cu and at least one kind of elements selected from the group of Ni, Co, Fe, Cr, V and W can be used.

Cu particles or alloy particles of Cu and Mo, which can form a minute projection with further uniformity, are more effective. These roughening particles for forming a minute projection are thought to increase peel strength since they bind chemically to a resin. Particles for increasing peel strength by chemical binding can include Cu—Mo alloy, Cu—Ni alloy, Cu—Co alloy, Cu—Fe alloy, Cu—Cr alloy, Cu—Mo—Ni alloy, Cu—Mo—Cr alloy, Cu—Mo—Co alloy, Cu—Mo—Fe alloy and the like, but according to resin species.

At least of one kind of element selected from the group of Mo, Ni, Fe, Cr, V and W contained in alloy particles for forming the minute projection is preferable to take up 0.01 ppm to 20% by weight based on the amount of Cu present. It is because of that an alloy composition where the amount thereof present is more than 20% by weight becomes difficult to dissolve upon etching a circuit pattern in a post process.

Moreover, it is better to provide a metal plating layer of at least one kind selected from the group of Ni, Ni alloy, Zn, Zn alloy, Ag on a surface with minute projections for the purpose of improving powder fall property, resistance to hydrochloric acid, heat resistance and conductivity. Furthermore, it is better to attach a metal plating layer of at least one kind of Ni, Ni alloy, Zn, Zn alloy, Ag also to a surface not provided with minute projections for the purpose of improving resistance to hydrochloric acid, heat resistance and conductivity. In order to achieve these purposes, the amount of metal attached is desirable to be not less than 0.05 mg/dm$^2$, not more than 10 mg/dm$^2$.

Anti-rust treatment by forming a Cr and/or chromate coating on a foil of a roughened surface of the above structure, or according to the need, silane coupling treatment or anti-rust treatment and silane coupling treatment is conducted.

A block copolymerized polyimide resin used in a resin composite copper foil of the invention is not particularly limited, as long as it has a structure that imide oligomers of a first structural unit and a second structural unit are bonded alternately and repeatedly. In terms of solder heat resistance under moisture absorption, the weight average molecular weights of imide oligomers of the first and the second structural unit are each preferable to be not less than 5000, and in terms of molecular weight controllability (easiness of controlling molecular weight) and application property (easiness of application), the weight average molecular weights of imide oligomers of the first and the second structural unit are each preferable to be not more than 30000 independently.

A block copolymerized polyimide resin (a) used in the invention is particularly preferable to be a block copolymerized polyimide resin (a) having structural units represented by the general formula (1) and the general formula (2). The reason is that it is excellent in chemical resistance, adhesion strength and solder heat resistance under moisture absorption. A tetracarboxylic dianhydride used in this block copolymerized polyimide resin (a) is 3,4,3',4'-biphenyl tetracarboxylic dianhydride, and diamines are 1,3-bis(3-aminophenoxy)benzene and 2,2-bis[4-(4-aminophenoxy)phenyl]propane.

[Chemical Formula 3]

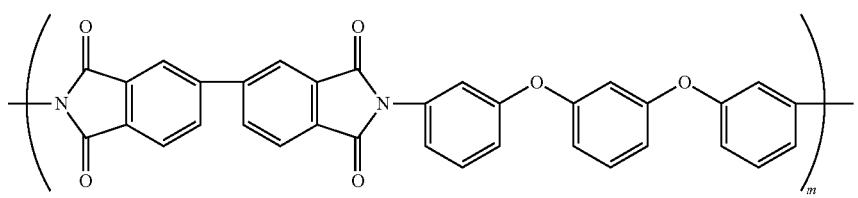

(1)

[Chemical Formula 4]

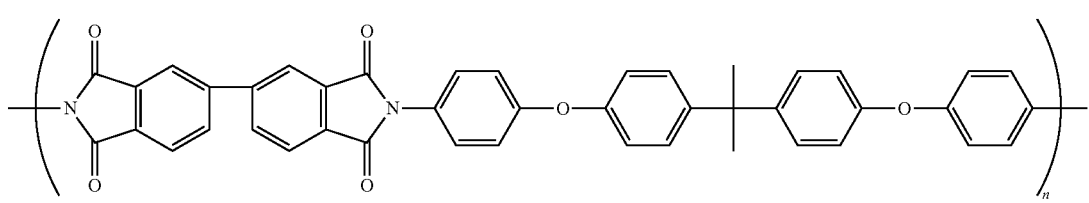

(2)

(In the formulae, m and n are each not less than 2, and m:n=1:9 to 3:1)

Also, in order to control the molecular weight of each unit polycondensate, by shifting the molar ratio of the tetracarboxylic dianhydride and the diamine upon the first stage reaction, having an acid anhydride or an amine at the end, and making the molar ratio of the tetracarboxylic dianhydride and another diamine or of another tetracarboxylic dianhydride and the diamine reverse to the first stage in the second stage reaction, it is possible to obtain a block copolymerized polyimide with a sufficient molecular weight.

The weight average molecular weight (Mw) of the entire block copolymerized polyimide resin (a) of the invention is desirable to be 50000 to 300000. More preferably, it is 80000 to 200000. When the Mw is less than 50000, a polyimide resin layer becomes fragile and is liable to be unable to be used for the object. On the other hand, when the Mw is more than 300000, the solution viscosity becomes too high and coating is liable to become difficult. Moreover, in order to control the final molecular weight, it is also possible to synthesize it by shifting the molar ratio of the tetracarboxylic dianhydride and the diamine to be used. The molar ratio of each of unit polycondensates of the general formula (1) and the general formula (2) is general formula (1): general formula (2)=1:9 to 3:1. More preferably, it is general formula (1):general formula (2)=1:3 to 3:1. When the rate of the structure of the general formula (1) becomes less than 10 mole %, decrease in adhesion strength is liable to be a problem, and when the rate of the structure of the general formula (2) becomes less than 25 mole %, decrease in solder heat resistance is liable to be a problem.

These block copolymerized polyimide resins are synthesized in a polar solvent by reacting a tetracarboxylic dianhydride with a diamine into an imide oligomer, and further adding the tetracarboxylic dianhydride and another diamine, or another tetracarboxylic dianhydride and the diamine to occur polymerization reaction for imidization one after another. In this regard, the weight average molecular weight of the initial imide oligomer is preferable to be 5000 to 30000.

A polar solvent to be used includes a polar solvent which dissolves polyimide, such as N-methyl-2-pyrrolidone, dimethylacetamide, dimethylformamide, dimethyl sulfoxide, sulfolane, and tetramethylurea. Additionally, it is also possible to use a mixture of ketone based or ether based solvents, and as ketone based solvents, methyl ethyl ketone, methyl propyl ketone, methyl isopropyl ketone, methyl butyl ketone, methyl isobutyl ketone, methyl-n-hexyl ketone, diethyl ketone, diisopropyl ketone, diisobutyl ketone, cyclopentanone, cyclohexanone, methylcyclohexanone, acetylacetone, diacetone alcohol, cyclohexene-n-one, and as ether based solvents, dipropyl ether, diisopropyl ether, dibutyl ether, tetrahydrofuran, tetrahydropyran, ethyl isoamyl alcohol, ethyl-t-butyl ether, ethyl benzyl ether, diethylene glycol dimethyl ether, cresyl methyl ether, anisole, phenetole are usable. Also, in order to remove water produced upon imidization reaction, it is required to add a solvent which azeotropes with water such as toluene and xylem to remove water out of the system. Moreover, in order to promote the reaction, an amine based catalyst such as pyridine and a two-component based catalyst of a base and a cyclic ester such as pyridine and γ-valerolactone are preferably used. With the reaction temperature of 120 to 200° C., it is possible to obtain a polar solvent solution of only block copolymerized polyimide resin by eventually removing a solvent which azeotropes with water such as toluene and xylene and a catalyst such as pyridine out of the system.

An inorganic filler (b) contained in the block copolymerized polyimide resin (a) of the invention is not particularly limited as long as it is generally used, but the specific examples include silicas such as natural silica, molten silica, amorphous silica and hollow silica, metal hydrates such as aluminum hydroxide, heat treated product of aluminum hydroxide (wherein aluminum hydroxide is heat treated and crystal water is partially reduced), boehmite and magnesium hydroxide, molybdenum compounds such as molybdenum oxide and zinc molybdate, titanium oxide, barium titanate, barium sulphate, zinc borate, zinc stannate, alumina, clay, kaolin, talc, calcined clay, calcined kaolin, calcined talc, mica, glass short fiber (fine glass powers of E-glass, D-glass, etc.), hollow glass, whisker, and the like. Preferably, the above mentioned silicas, metal hydrates such as aluminum hydroxide, heat treated product of aluminum hydroxide (wherein aluminum hydroxide is heat treated and crystal water is partially reduced), boehmite and magnesium hydroxide, talc, calcinated talc, and the like are used. These are used as one kind or in combination of two kinds or more accordingly. The amount of the inorganic filler contained is not particularly limited, but preferable to be within a range of 5 to 50% by volume based on total 100% by volume of the block copolymerized polyimide resin (a) and the inorganic filler (b) in terms of heat resistance. More preferably, it is better to be not less than 19% by volume, not more than 40% by volume. Even more preferably, it is better to be not less than 19% by volume, not more than 30% by volume. Moreover, in order to evenly disperse the inorganic filler (b) in the block copolymerized polyimide resin (a), it is preferable to use various dispersers. Furthermore, in order to enhance close adherence between the inorganic filler (b) and the block copolymerized polyimide resin (a), it is also effective to treat the inorganic filler (b) with a coupling agent such as a silane coupling agent and add a suitable amount of the coupling agent to the resin. The average particle size of the inorganic filler (b) is preferable to be not more than 4 μm, and more preferable to be not more than 1 μm, in terms of uniformity of the block copolymerized polyimide resin (a).

A maleimide compound (c) used in the block copolymerized polyimide resin (a) of the resin composite copper foil of the invention is not particularly limited, as long as it is a compound having two or more maleimide groups in one molecule. Preferably, bis(4-maleimidephenyl)methane, polyphenyl methane maleimide, m-phenylene bismaleimide, bisphenol A diphenyl ether bismaleimide(2,2'-bis[4-(4-maleimidephenoxy)phenyl]propane), 3,3'-dimethyl-5,5'-diethyl-4,4'-diphenyl methane bismaleimide, 4-methyl-1,3-phenylene bismaleimide are included, and more preferably, bisphenol A diphenyl ether bismaleimide(2,2'-bis[4-(4-maleimidephenoxy)phenyl]propane) is included. It is also possible to use one kind of the maleimide compounds or a combination of two kinds or more accordingly. Moreover, it is also possible to use a prepolymer of a maleimide compound, or a prepolymer of a maleimide compound and an amine compound. A 2,2-bis[4-(4-maleimidephenoxy)phenyl]propane (d) used in the resin composition (B) of the resin composite electrolytic copper foil of the invention is represented by the chemical formula (3).

[Chemical Formula 5]

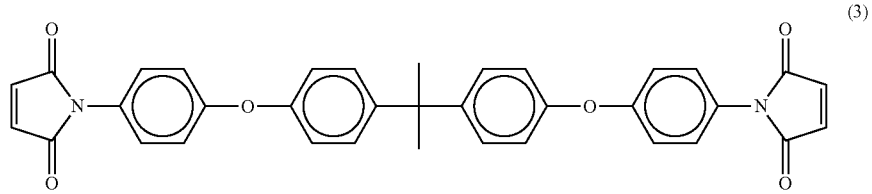

(3)

The content ratio of the block copolymerized polyimide (a) and the maleimide compound (c) in the resin layer of the resin composite copper foil is preferable to be within a range of 1:9 to 9:1 in the weight ratio, and more preferable content ratio is 60:40 to 40:60 in the weight ratio.

The thickness of resin composition (B) of the resin composite electrolytic copper foil of the invention can be adjusted according to the surface roughness level of the copper foil, and is preferable to be 1 to 10 μm. When the thickness is more than 10 μm, drying in the heating step after the copper foil coating is liable to be insufficient and the heat resistance of the copper clad laminate used may decrease. When the thickness is less than 1 μm, many craters are liable to occur in the copper foil coating. In addition, the thickness is particularly more preferable to be 1 to 5 μm.

As a preparation example of the resin composite copper foil of the invention, it is prepared by adding the maleimide compound (c) if needed to a polar solvent solution of the block copolymerized polyimide resin (a) obtained in the synthesis method described above and stirring, dispersing the inorganic filler (b) in a publicly known method, directly coating it on a roughened surface of the copper foil, and drying. As a coating method, various methods such as reverse roll, rod (bar), blade, knife, die, gravure, and rotary screen are possible. For drying, a hot wind dryer, an infrared ray dryer and the like can be used, but not particularly limited thereto as long as it can heat to a temperature sufficient enough to remove the solvent used. Moreover, in order to prevent oxidation of the copper foil, methods of drying at a temperature not more than 200° C. for a long time, and drying at a further higher temperature under vacuum or an inert atmosphere such as nitrogen are also possible.

A resin composition used in the B-stage resin composition layer capable of being preferably laminate molded with the resin composite electrolytic copper foil of the invention is not particularly limited, as long as it is a publicly known thermosetting resin composition for use in a printed wiring board. These resins include epoxy resin, polyimide resin, cyanate ester resin, maleimide resin, double bond added polyphenylene ether resin, resin compositions of thereof with bromine and phosphorus containing compounds and the like for example, and one kind or a combination of two kinds or more is used. A resin composition having a cyanate ester resin as an essential component is preferably used in a combination with, for example, an epoxy resin and the like, in terms of reliability of migration resistance, heat resistance and the like. It is possible to use a publicly known catalyst, setting agent and setting accelerator, if needed, to these thermosetting resins.

The cyanate ester resin preferably used in the resin composition used in the B-stage resin composition layer is a compound having two or more cyanato groups within a molecule. Specific examples are 1,3- or 1,4-dicyanato benzene, 1,3,5-tricyanato benzene, 1,3-, 1,4-, 1,6-, 1,8-, 2,6- or 2,7-dicyanato naphthalene, 1,3,6-tricyanato naphthalene, 4,4-dicyanatobiphenyl, bis(4-dicyanatophenyl)methane, 2,2-bis(4-cyanatophenyl)propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris (4-cyanatophenyl)phosphite, tris(4-cyanatophenyl) phosphate, cyanates obtained by reaction of a novolac and a cyanogen halide, and the like.

Other than these, phenol novolac type cyanate ester compounds described in Japanese Examined Patent Application Publication No. S41-1928, Japanese Patent Application Laid-open Publication Nos. S43-18468, S44-4791, S45-11712, S46-41112, S47-26853 and S51-63149, and the like can also be used. Moreover, naphthalene type cyanate ester compounds can also be used. Furthermore, a prepolymer with a molecular weight of 400 to 6000 having a triazine ring formed by trimerization of a cyanato group of these cyanate ester compounds is used. This prepolymer can be obtained by polymerizing the above cyanate ester monomers with a catalyst including acids such as mineral acid and Lewis acid; bases such as sodium alcolates and tertiary amines; salts such as sodium carbonate for example. This resin contains a partially unreacted monomer in the form of a mixture of a monomer and a prepolymer, and such material is preferably used in the application of the invention. Furthermore, a cyanated polyphenylene ether resin can also be used. A monofunctional cyanate ester compound can also be added to these in an amount which does not significantly affect properties. It is preferably 1 to 10% by weight. These cyanate ester resins are not limited to the above, but publicly known ones are usable. These are used as one kind or in combination of two kinds or more accordingly.

As an epoxy resin preferably used in combination with the cyanate ester resin, publicly known one can be used. Specifically, bisphenol A type epoxy resin, bisphenol F type epoxy resin, phenol novolac type epoxy resin, cresol novolac type epoxy resin, alicyclic epoxy resin, biphenyl type epoxy resin, fluorene type epoxy resin, resorcinol type epoxy resin, naphthalene type epoxy resin, phenol aralkyl type epoxy resin, biphenyl aralkyl type epoxy resin, epoxidized polyphenylene ether resin; polyepoxy compounds having epoxidized double bonds of butadiene, pentadiene, vinyl cyclohexene, dicyclopentyl ether and the like; polyol, polyglycidyl compounds obtained by reaction of hydroxyl group containing silicone resins and an epichlorohydrin, and the like are included. Also, publicly known bromine added resins, phosphorous containing epoxy resin, and the like thereof are included. These are used as one kind or in combination of two kinds or more accordingly.

As a phenolic resin used in the B-stage resin composition layer, publicly known one can be used. Specifically, novolac type phenolic resin, cresol type phenolic resin, aryl alkylene type phenolic resin, and the like are included. Also, publicly known bromine added resins, phosphorous containing resin, and the like thereof are included. These are used as one kind or in combination of two kinds or more accordingly.

In the resin composition used in the B-stage resin composition layer, various additives can be contained if desired within the range where the original properties of the composition are not deteriorated. As these additives, polymerized double bond containing monomers such as unsaturated polyester and prepolymers thereof; low molecular weight liquid to high molecular weight elastic rubbers such as polybutadiene, maleinated butadiene, butadiene-acrylonitrile copolymer, polychloroprene, butadiene-styrene copolymer, polyisoprene, butyl rubber, fluorine rubber, and natural rubber; polyethylene, polypropylene, polybutene, poly-4-methylpenten, polystyrene, AS resin, ABS resin, MBS resin, styrene-isoprene rubber, acryl rubber, core shell rubber thereof, polyethylene-propylene copolymer, 4-fluorinated ethylene-6-fluorinated ethylene copolymers; high molecular weight prepolymer or oligomer such as polycarbonate, polyphenylene ether, polysulfone, polyester, and polyphenylene sulfide; polyurethane, and the like are exemplified, and used accordingly. Also, other than these, various additives such as publicly known organic filler, inorganic filler, dye, pigment, thickener, lubricant, defoamer, disperser, leveling agent, photosensitizer, flame retardant, brightener, polymerization inhibitor, and thixotropic agent are used in combination accordingly if desired. If needed, a setting agent and a catalyst are contained accordingly in a compound having a reactive group.

Particularly when processing such as piercing is conducted by carbon dioxide gas laser, in order to have a good hole shape, it is preferable to add an inorganic filler to the B-stage resin composition layer. As an inorganic filler, the same one to the inorganic filler (b) contained in the block copolymerized polyimide resin (a) of the invention can be used, and preferably silicas such as molten silica, metal hydrates such as aluminum hydroxide, heat treated product of aluminum hydroxide (wherein aluminum hydroxide is heat treated and crystal water is partially reduced), boehmite and magnesium hydroxide, talc, calcinated talc, and the like are used. These are used as one kind or in combination of two kinds or more accordingly, and the amount of the inorganic filler (b) contained is not particularly limited, but preferable to be within a range of 5 to 50% by volume in total 100% by volume of the B-stage resin and the inorganic filler used in the B-stage resin composition layer, in terms of processability by carbon dioxide gas laser. More preferably, it is better to be 10 to not more than 40% by volume. Even more preferably, it is better to be not less than 15% by volume, not more than 30% by volume.

A method for preparing the B-stage resin composition layer used in the invention is not particularly limited, but it is prepared in publicly known methods such as a method of preparing a varnish by dissolving/dispersing a thermosetting resin composition in a solvent or without any solvent, applying it to one surface of a mold release film and drying it to form a B-stage resin composition sheet, and a method of applying it to a base material, drying and B-staging to form a prepreg, a method of directly applying it onto a substrate having a conductive circuit formed and drying it to form a B-stage resin composition layer, for example. The thickness of this B-stage resin composition layer is not particularly limited, but in the case of sheet, it is preferably 4 to 150 µm, and it is also the same in the case of application. In the case of prepreg, the thickness is preferably 10 to 200 µm.

For the B-stage resin composition layer used in the invention, it is preferable to use a base material in terms of the property of the resulting copper clad laminate. A base material to be used is not particularly limited, as long as it is a publicly known base material for use in a printed wiring board. Specifically, a nonwoven cloth, a woven cloth and the like of generally and publicly known glass fibers such as E, NE, D, S and T-glasses are included. These base materials are preferable to be subjected to publicly known surface treatment so as to improve close adherence to the resin composition.

Moreover, a method for producing a copper clad laminate in the invention is to arrange the resin composition layer surface of the resin composite copper foil opposing the above B-stage resin composition layer and to laminate mold. Specifically, a copper clad laminate is produced by arranging the resin composition layer surface of the above resin composite electrolytic copper foil opposing on at least one surface of the B-stage resin composition layer or the laminate with an inner layer circuit formed having the B-stage resin composition layer arranged or formed on both surfaces, heating, pressurizing, and laminate molding preferably under vacuum. A printed wiring board of the invention is produced by forming a conductive circuit on these copper clad laminate and multilayer copper clad laminate in a publicly known method, and then conducting plating treatment and the like.

The kind of laminates with an inner layer circuit formed for use in these is not particularly limited, and a publicly known laminate, a metal foil clad board, preferably a copper clad board for a printed wiring board material can be used. Specifically, publicly known ones such as an inorganic fiber and/or organic fiber base material copper clad laminate, a heat resistant film base material copper clad board using a thermosetting resin composition and/or a thermoplastic resin composition, further a composite base material copper clad laminate in combination of these base materials and a multilayer copper clad board thereof, and a multilayer copper clad board prepared by the additive method can be used. The conductor thickness of the inner layer circuit substrate is not particularly limited, but is preferably 3 to 35 µm. This conductive circuit is preferable to be subjected to publicly known treatments for enhancing close adherence to the resin of the B-stage resin composition layer, such as black copper oxide treatment and liquid chemical treatment (e.g. CZ treatment by MEC).

Lamination conditions of the invention are not particularly limited, but are preferably laminate molding at a temperature of 100 to 250° C., a pressure of 5 to 40 kgf/cm$^2$ and a degree of vacuum of not more than 30 mmHg for about 30 minutes to 5 hours. Although lamination may be conducted under this condition from the beginning to the end, it is also possible to laminate mold until gelation of the B-stage resin composition layer and then take out for post-setting in a furnace.

A method for producing the printed wiring board of the invention is not particularly limited, but the following methods are preferable. The above copper clad laminate is used, piercing of throughholes and blind vias is conducted with a drill, laser and the like, desmear treatment is conducted with permanganates, if needed, to prepare a perforated copper clad laminate, the copper foil is entirely removed by etching, and then electroless copper plating is conducted without conducting roughening treatment on the exposed resin composition layer surface of the laminate. Alternatively, the above copper clad laminate of the invention is used, the copper foil is entirely removed by etching, piercing of throughholes and blind vias is conducted with a drill, laser and the like, desmear treatment is conducted with permanganates, if needed, and electroless copper plating is conducted. In addition, an etching removal method is not particularly limited in the kinds of etching solutions, and a publicly known method is applicable.

Generally, a copper layer preferably with a thickness of 0.5 to 2 μm is formed by forming a palladium catalyst on the resin film surface, and then immersing it in an electroless copper plating solution. Next, a strongly adhered copper circuit is formed by conducting electrolytic copper plating on the entire surface and etching, or a strongly adhered copper circuit is formed by selectively attaching electrolytic copper plating and etching to remove a thickness portion of at least the electroless copper plated layer. The thickness of the electrolytic copper plating is optionally selected. In this regard, for further improving the adhesion strength of the copper plated layer, it is preferable to heat treat the electroless copper plated layer at 100° C. to 200° C. after formation. The heating time is not particularly limited, but is preferably selected from 30 minutes to 5 hours. It is preferable to heat under vacuum and an inert gas for preventing oxidation of the copper foil.

A method for forming a copper circuit thereafter is conducted according to a publicly known subtractive method or pattern plating method to prepare a printed wiring board. Specifically, in the case of patterning by the subtractive method, a printed wiring board is prepared by coating a portion where a copper circuit is to be formed on a copper plated layer with an etching resist, and selectively removing the copper plated layer by a publicly known etching method to form a circuit pattern. Moreover, in the case of patterning by the pattern plating method, a printed wiring board is prepared by forming an electroless copper plated layer of about 0.5 to 1 μm, selectively coating other than the site where a copper circuit is to be formed with a plating resist, forming an electrolytic copper plated layer of about 10 to 30 μm, peeling the plating resist, and etching at least the electroless copper plated layer where the electrolytic copper plated layer is not formed to form a pattern.

EXAMPLES

The invention will be described specifically in Synthesis Examples, Comparative Synthesis Examples, Examples and Comparative Examples below. However, the invention is not limited to these examples. It should be noted that "parts" refers to the number of parts by weight in the solid content, unless otherwise stated.

Synthesis Example 1

To a 2 L three neck flask having a reflux cooler equipped with a ball cooling tube mounted on a trap with an anchor shaped stirring stick, a nitrogen introducing tube and a stop cock of stainless steel, 117.68 g (400 mmol) of 3,4,3',4'-biphenyl tetracarboxylic dianhydride, 87.7 g (300 mmol) of 1,3-bis(3-aminophenoxy)benzene, 4.0 g (40 mmol) of γ-valerolactone, 4.8 g (60 mmol) of pyridine, 300 g of N-methyl-2-pyrrolidone (hereinafter referred to as NMP) and 20 g of toluene were added, heated at 180° C. for 1 hour and then cooled to about room temperature, and subsequently 29.42 g (100 mmol) of 3,4,3',4'-biphenyl tetracarboxylic dianhydride, 82.12 g (200 mmol) of 2,2-bis[4-(4-aminophenoxy)phenyl]propane, 200 g of NMP and 40 g of toluene were added, mixed at room temperature for 1 hour and then heated at 180° C. for 3 hours to obtain a block copolymerized polyimide resin with a solid content of 38%. In this block copolymerized polyimide resin, general formula (1):general formula (2)=3:2, number average molecular weight: 70000, weight average molecular weight: 150000. Also, the weight average molecular weight of a block of imide oligomers of a structural unit represented by the general formula (1) was 7000. This block copolymerized polyimide resin solution was further diluted with NMP into a block copolymerized polyimide resin solution with a solid content of 15% to obtain a block copolymerized polyimide (a1).

Synthesis Example 2

To a 2 L three neck flask having a reflux cooler equipped with a ball cooling tube mounted on a trap with an anchor shaped stirring stick, a nitrogen introducing tube and a stop cock of stainless steel, 117.68 g (400 mmol) of 3,4,3',4'-biphenyl tetracarboxylic dianhydride, 123.18 g (300 mmol) of 2,2-bis[4-(4-aminophenoxy)phenyl]propane, 4.0 g (40 mmol) of γ-valerolactone, 4.8 g (60 mmol) of pyridine, 300 g of NMP and 20 g of toluene were added, heated at 180° C. for 1 hour and then cooled to about room temperature, and subsequently 29.42 g (100 mmol) of 3,4,3',4'-biphenyl tetracarboxylic dianhydride, 58.47 g (200 mmol) of 1,3-bis(3-aminophenoxy)benzene, 200 g of NMP and 40 g of toluene were added, mixed at room temperature for 1 hour and then heated at 180° C. for 3 hours to obtain a block copolymerized polyimide resin with a solid content of 38%. In this block copolymerized polyimide resin, general formula (1):general formula (2)=2:3, number average molecular weight: 75000, weight average molecular weight: 160000. Also, the weight average molecular weight of a block of imide oligomers of a structural unit represented by the general formula (2) was 8000. This block copolymerized polyimide resin solution was further diluted with NMP into a block copolymerized polyimide resin solution with a solid content of 15% to obtain a block copolymerized polyimide (a2).

Synthesis Example 3

To a 2 L three neck flask having a reflux cooler equipped with a ball cooling tube mounted on a trap with an anchor shaped stirring stick, a nitrogen introducing tube and a stopcock of stainless steel, 117.68 g (400 mmol) of 3,4,3',4'-biphenyl tetracarboxylic dianhydride, 73.08 g (250 mmol) of 1,3-bis(3-aminophenoxy)benzene, 4.0 g (40 mmol) of γ-valerolactone, 4.8 g (60 mmol) of pyridine, 300 g of N-methyl-2-pyrrolidone (hereinafter referred to as NMP) and 20 g of toluene were added, heated at 180° C. for 1 hour and then cooled to about room temperature, and subsequently 29.42 g (100 mmol) of 3,4,3',4'-biphenyl tetracarboxylic dianhydride, 102.65 g (250 mmol) of 2,2-bis[4-(4-aminophenoxy)phenyl]propane, 200 g of NMP and 40 g of toluene were added, mixed at room temperature for 1 hour and then heated at 180° C. for 2 hours to obtain a block copolymerized polyimide with a solid content of 38%. In this block copolymerized polyimide, general formula (1): general formula (2)=1:1, number average molecular weight: 50000, weight average molecular weight: 100000. Also, the weight average molecular weight of a block of imide oligomers of a structural unit represented by the general formula (1) was 6000. This block copolymerized polyimide resin solution was diluted with NMP into a block copolymerized polyimide resin solution with a solid content of 15% to obtain a block copolymerized polyimide (a3).

Comparative Synthesis Example 1

To a 2 L three neck flask having a reflux cooler equipped with a ball cooling tube mounted on a trap with an anchor shaped stirring stick, a nitrogen introducing tube and a stopcock of stainless steel, 164 g (400 mmol) of ethylene glycol bistrimerytate dianhydride, 124 g (400 mmol) of 4,4'-diamino-3,3',5,5'-tetraethyldiphenylmethane, 4.0 g (40 mmol) of γ-valerolactone, 4.8 g (60 mmol) of pyridine, 300 g of NMP and 20 g of toluene were added, and heated at 180° C. for 3 hours to obtain a polyimide resin solution. In this polyimide resin, number average molecular weight: 31000, weight average molecular weight 78000. This polyimide resin solution (a) was further diluted with NMP into a polyimide resin solution with a solid content of 15% to obtain a comparative polyimide (e1).

Comparative Synthesis Example 2

To a 2 L three neck flask having a reflux cooler equipped with a ball cooling tube mounted on a trap with an anchor shaped stirring stick, a nitrogen introducing tube and a stopcock of stainless steel, 147.1 g (500 mmol) of 3,4,3',4'-biphenyl tetracarboxylic dianhydride, 73.08 g (250 mmol) of 1,3-bis(3-aminophenoxy)benzene, 102.65 g (250 mmol) of 2,2-bis[4-(4-aminophenoxy)phenyl]propane, 4.0 g (40 mmol) of γ-valerolactone, 4.8 g (60 mmol) of pyridine, 500 g of N-methyl-2-pyrolidone and 60 g of toluene were added, mixed at room temperature for 1 hour, and heated at 180° C. for 3 hours to obtain a random copolymerized polyimide with a solid content of 38%. In this random copolymerized polyimide, general formula (1):general formula (2)=1:1, number average molecular weight: 50000, weight average molecular weight: 100000. This random copolymerized polyimide resin solution was diluted with NMP into a random copolymerized polyimide resin solution with a solid content of 15% to obtain a random copolymerized polyimide (e2).

Example 1

Figure 3:
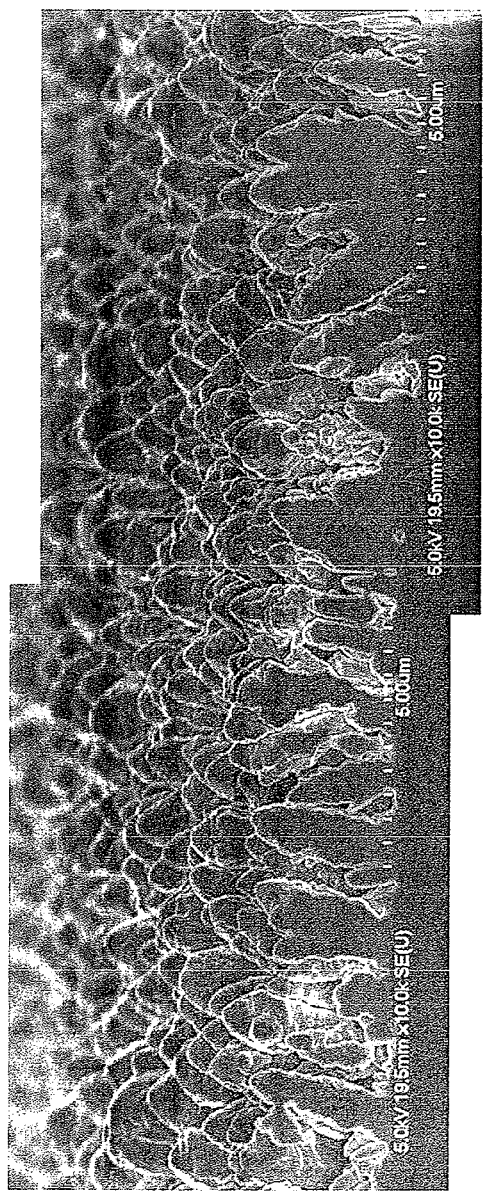
FIG. 3 is an enlarged photo showing a cross sectional surface of an electrolytic copper foil of the invention.

The block copolymerized polyimide resin (a1) solution obtained in Synthesis Example 1 was further diluted with NMP into a block copolymerized polyimide resin solution with a solid content of 10%. The resulting resin solution was coated on a roughened surface of an electrolytic copper foil with a thickness of 12 μm (FWG-WS foil made by Furukawa Electric, Rz=2.0 μm, lightness value 20, 3400 to 3800 minute projections with a height of 2 to 3 μm are located in an area of 100 μm×100 μm on a roughened surface, 12 to 17 minute projections are substantially evenly located within a range of the observation cross sectional surface of 25 μm, the minute projection has a plurality of bored portions on the lateral thereof as shown in FIG. 3) using a reverse roll coater under the drying condition of at 120° C. for 3 minutes and at 180° C. for 3 minutes to prepare a resin composite electrolytic copper foil with a resin thickness of 2 μm. On the other hand, 400 g of 2,2-bis(4-cyanatophenyl)propane was molten at 150° C. and reacted for 4 hours while stirred, this was dissolved in methyl ethyl ketone, and 600 g of brominated bisphenol A type epoxy resin (Epiclon 1123P, made by DIC) and 0.1 part of zinc octoate were further added to prepare a varnish. This varnish was impregnated in a glass woven cloth base material with a thickness of 100 μm and dried at 150° C. for 6 minutes to prepare a B-stage resin composition layer (prepreg) with a resin content of 45%, a thickness of 105 μm and a gelation time (at 170° C.) of 120 seconds. A copper clad laminate with a thickness of 0.4 mm was prepared by arranging the above resin composition layer surface of the resin composite electrolytic copper foil opposing on the upper and the lower surfaces of four of these prepregs superimposed, and laminate molding at a temperature of 220° C., a pressure of 40 kgf/cm² and a degree of vacuum of not more than 30 mmHg for 1 hour.

Regarding the copper clad laminate prepared, the copper foil was entirely removed with a hydrogen peroxide/sulfuric acid solution, and then desmear treatment was conducted in swelling treatment (mixing 400 ml of OPC-B103 PreEtch of Okuno Chemical Industries and sodium hydroxide 13 g/l aqueous solution as a reagent, immersing under a temperature of 65° C. for 5 minutes, then washing with water for 1 minute), roughening treatment (mixing 100 ml of OPC-1200 EpoEtch of Okuno Chemical Industries and potassium permanganese 45 g/l aqueous solution, immersing under a temperature of 80° C. for 8 minutes, then washing with water for 1 minute) and neutralizing treatment (immersing in OPC-B303 neutralizing agent of Okuno Chemical Industries 200 ml/l aqueous solution under a temperature of 45° C. for 5 minutes, then washing with water for 1 minute) processes. Moreover, a copper layer with a thickness of 1 μm was formed with an electroless plating solution (ATS AddCopper CT, made, by Okuno Chemical Industries) and heated in a furnace at 130° C. for 2 hours, and electrolytic copper plating at 1.5 ampere/dm² for 70 minutes was conducted with a copper sulfate plating solution to prepare a laminate having a copper layer with a thickness of 20 μm formed. The evaluation result is shown in Table 1.

Example 2, 3

Laminates having a copper layer with a thickness of 20 μm formed were prepared similarly as Example 1, except that the block copolymerized polyimide resins (a2, a3) obtained in Synthesis Examples 2 and 3 were used instead of the block copolymerized polyimide resin (a1) obtained in Synthesis Example 1. The evaluation result is shown in Table 1.

Example 4

A laminate having a copper layer with a thickness of 20 μm formed was prepared similarly as Example 1, except that a copper foil (HLPLCN foil made by Nippon Mining & Metal, Rz=1.5 μm, lightness value 22, 3600 to 4000 minute projections with a height of 2 to 3 μm are located in an area of 100 μm×100 μm on a roughened surface, 14 to 20 minute projections are substantially evenly located within a range of the observation cross sectional surface of 25 μm, the minute projection has a plurality of bored portions on the lateral thereof as shown in FIG. 2) was used instead of the electrolytic copper foil (FWG-WS foil). The evaluation result is shown in Table 1.

Example 5

The block copolymerized polyimide resin (a1) solution obtained in Synthesis Example 1 was further diluted with NMP into a block copolymerized polyimide resin solution with a solid content of 10%. To 1,000 g of this solution, 100 g of 2,2-bis[4-(4-maleimidephenoxy)phenyl]propane (BMI-80, KI Chemical Industry) and 100 g of NMP were melt mixed at 60° C. for 20 minutes to prepare a resin solution. The resulting resin solution was coated on a roughened surface of an electrolytic copper foil with a thickness of 12

μm (FWG-WS foil made by Furukawa Electric, Rz=2.0 μm, lightness value 20, 3400 to 3800 minute projections with a height of 2 to 3 μm are located in an area of 100 μm×100 μm on a roughened surface, 12 to 17 minute projections are substantially evenly located within a range of the observation cross sectional surface of 25 μm, the minute projection has a plurality of bored portions on the lateral thereof as shown in FIG. 3) using a reverse roll coater under the drying condition of at 120° C. for 3 minutes and at 180° C. for 3 minutes to prepare a resin composite electrolytic copper foil with a resin thickness of 2 μm. On the other hand, 400 g of 2,2-bis(4-cyanatophenyl)propane was molten at 150° C. and reacted for 4 hours while stirred, this was dissolved in methyl ethyl ketone, and 600 g of brominated bisphenol A type epoxy resin (Epiclon 1123P, made by DIC) and 0.1 part of zinc octoate were further added to prepare a varnish. This varnish was impregnated in a glass woven cloth base material with a thickness of 100 μm and dried at 150° C. for 6 minutes to prepare a B-stage resin composition layer (prepreg) with a resin content of 45%, a thickness of 105 μm and a gelation time (at 170° C.) of 120 seconds. A copper clad laminate with a thickness of 0.4 mm was prepared by arranging the above resin composition layer surface of the resin composite electrolytic copper foil opposing on the upper and the lower surfaces of four of these prepregs superimposed, and laminate molding at a temperature of 220° C., a pressure of 40 kgf/cm$^2$ and a degree of vacuum of not more than 30 mmHg for 1 hour.

Regarding the copper clad laminate prepared, the copper foil was entirely removed with a hydrogen peroxide/sulfuric acid solution, and then desmear treatment was conducted in swelling treatment (mixing 400 ml of OPC-B103 PreEtch of Okuno Chemical Industries and sodium hydroxide 13 g/l aqueous solution as a reagent, immersing under a temperature of 65° C. for 5 minutes, then washing with water for 1 minute), roughening treatment (mixing 100 ml of OPC-1200 EpoEtch of Okuno Chemical Industries and potassium permanganese 45 g/l aqueous solution, immersing under a temperature of 80° C. for 8 minutes, then washing with water for 1 minute) and neutralizing treatment (immersing in OPC-B303 neutralizing agent of Okuno Chemical Industries 200 ml/l aqueous solution under a temperature of 45° C. for 5 minutes, then washing with water for 1 minute) processes. Moreover, a copper layer with a thickness of 1 μm was formed with an electroless plating solution (ATS AddCopper CT, made by Okuno Chemical Industries) and heated in a furnace at 130° C. for 2 hours, and electrolytic copper plating at 1.5 ampere/dm$^2$ for 70 minutes was conducted with a copper sulfate plating solution to prepare a laminate having a copper layer with a thickness of 20 μm formed. The evaluation result is shown in Table 2.

Example 6, 7

Laminates having a copper layer with a thickness of 20 μm formed were prepared similarly as Example 5, except that the block copolymerized polyimide resins (a2, a3) obtained in Synthesis Examples 2 and 3 were used. The evaluation result is shown in Table 2.

Example 8

A laminate having a copper layer with a thickness of 20 μm formed was prepared similarly as Example 5, except that bis(4-maleimidephenyl)methane (BMI, KI Chemical Industry) as a maleimide compound was used. The evaluation result is shown in Table 2.

Example 9

A laminate having a copper layer with a thickness of 20 μm formed was prepared similarly as Example 5, except that a copper foil (HLPLCN foil made by Nippon Mining & Metal, Rz=1.5 μm, lightness value 22, 3600 to 4000 minute projections with a height of 2 to 3 μm are located in an area of 100 μm×100 μm on a roughened surface, 14 to 20 minute projections are substantially evenly located within a range of the observation cross sectional surface of 25 μm, the minute projection has a plurality of bored portions on the lateral thereof as shown in FIG. 2) was used instead of the electrolytic copper foil (FWG-WS foil). The evaluation result is shown in Table 2.

Example 10

The block copolymerized polyimide resin (a1) solution obtained in Synthesis Example 1 was further diluted with NMP into a block copolymerized polyimide resin solution with a solid content of 10%. To 1,000 g of this solution, 70 parts of boehmite with an average particle size of 0.6 μm (product name: C06 made by Taimei Chemicals) as the inorganic filler (b) was added, and stirred with a homomixer for 1 hour to obtain a varnish of block copolymerized polyimide containing an inorganic filler. The content ratio by volume of the inorganic filler in the solid content of this varnish was 23%. This varnish was applied to a roughened surface of an electrolytic copper foil with a thickness of 12 μm (FWG-WS foil made by Furukawa Electric, Rz=2.0 μm, lightness value 20, 3400 to 3800 minute projections with a height of 2 to 3 μm are located in an area of 100 μm×100 μm on a roughened surface, 12 to 17 minute projections are substantially evenly located within a range of the observation cross sectional surface of 25 μm, the minute projection has a plurality of bored portions on the lateral thereof as shown in FIG. 3) using a reverse roll coater, and dried under a nitrogen atmosphere at 120° C. for 3 minutes and at 170° C. for 3 minutes to prepare a resin composite copper foil. On the other hand, 400 g of 2,2-bis(4-cyanatophenyl)propane was molten at 150° C. and reacted for 4 hours while stirred, this was dissolved in methyl ethyl ketone, and 600 g of brominated bisphenol A type epoxy resin (Epiclan 1123P, made by DIC) and 0.1 part of zinc octoate were further added to prepare a varnish. This varnish was impregnated in a glass woven cloth base material with a thickness of 100 μm and dried at 150° C. for 6 minutes to prepare a B-stage resin composition layer (prepreg) with a resin content of 45%, a thickness of 105 μm and a gelation time (at 170° C.) of 120 seconds. A copper clad laminate with a thickness of 0.4 mm was prepared by arranging the above resin composition layer surface of the resin composite electrolytic copper foil opposing on the upper and the lower surfaces of four of these prepregs superimposed, and laminate molding at a temperature of 220° C., a pressure of 40 kgf/cm$^2$ and a degree of vacuum of not more than 30 mmHg for 1 hour.

Regarding the copper clad laminate prepared, the copper foil was entirely removed with a hydrogen peroxide/sulfuric acid solution, and then desmear treatment was conducted in swelling treatment (mixing 400 ml of OPC-B103 PreEtch of Okuno Chemical Industries and sodium hydroxide 13 g/l aqueous solution as a reagent, immersing under a temperature of 65° C. for 5 minutes, then washing with water for 1 minute), roughening treatment (mixing 100 ml of OPC-1200 EpoEtch of Okuno Chemical Industries and potassium permanganese 45 g/l aqueous solution, immersing under a temperature of 80° C. for 8 minutes, then washing with water for 1 minute) and neutralizing treatment (immersing in OPC-B303 neutralizing agent of Okuno Chemical Industries 200 ml/l aqueous solution under a temperature of 45° C. for 5 minutes, then washing with water for 1 minute) processes. Moreover, a copper layer with a thickness of 1 µm was formed with an electroless plating solution (ATS AddCopper CT, made by Okuno Chemical Industries) and heated in a furnace at 130° C. for 2 hours, and electrolytic copper plating at 1.5 ampere/dm$^2$ for 70 minutes was conducted with a copper sulfate plating solution to prepare a laminate having a copper layer with a thickness of 20 µm formed. The evaluation result is shown in Table 3.

Example 11

The block copolymerized polyimide resin (a1) solution obtained in Synthesis Example 1 was further diluted with NMP into a block copolymerized polyimide resin solution with a solid content of 10%. To 1,000 g of this solution, 100 g of 2,2-bis[4-(4-maleimidephenoxy)phenyl]propane (BMI-80, KI Chemical Industry) and 100 g of NMP were melt mixed at 60° C. for 20 minutes to prepare a resin solution. To the resulting resin solution, 140 parts of boehmite with an average particle size of 0.6 µm (product name; C06 made by Taimei Chemicals) as the inorganic filler (b) was further added, and stirred with a homomixer for 1 how to obtain a varnish of block copolymerized polyimide containing an inorganic filler. The content ratio by volume of the inorganic filler in the solid content of this varnish was 20%. This varnish was coated on a roughened surface of an electrolytic copper foil with a thickness of 12 µm (FWG-WS foil made by Furukawa Electric, Rz=2.0 µm, lightness value 20, 3400 to 3800 minute projections with a height of 2 to 3 µm are located in an area of 100 µm×100 µm on a roughened surface, 12 to 17 minute projections are substantially evenly located within a range of the observation cross sectional surface of 25 µm, the minute projection has a plurality of bored portions on the lateral thereof as shown in FIG. 3) using a reverse roll coater, under the drying condition of at 120° C. for 3 minutes and at 180° C. for 3 minutes to prepare a resin composite electrolytic copper foil with a resin thickness of 2 µm. On the other hand, 400 g of 2,2-bis(4-cyanatophenyl)propane was molten at 150° C. and reacted for 4 hours while stirred, this was dissolved in methyl ethyl ketone, and 600 g of brominated bisphenol A type epoxy resin (Epiclon 1123P, made by DIC) and 0.1 part of zinc octoate were further added to prepare a varnish. This varnish was impregnated in a glass woven cloth base material with a thickness of 100 µm and dried at 150° C. for 6 minutes to prepare a B-stage resin composition layer (prepreg) with a resin content of 45%, a thickness of 105 µm and a gelation time (at 170° C.) of 120 seconds. A copper clad laminate with a thickness of 0.4 mm was prepared by arranging the above resin composition layer surface of the resin composite electrolytic copper foil opposing on the upper and the lower surfaces of four of these prepregs superimposed, and laminate molding at a temperature of 220° C., a pressure of 40 kgf/cm$^2$ and a degree of vacuum of not more than 30 mmHg for 1 hour.

Regarding the copper clad laminate prepared, the copper foil was entirely removed with a hydrogen peroxide/sulfuric acid solution, and then desmear treatment was conducted in swelling treatment (mixing 400 ml of OPC-B103 PreEtch of Okuno Chemical Industries and sodium hydroxide 13 g/l aqueous solution as a reagent, immersing under a temperature of 65° C. for 5 minutes, then washing with water for 1 minute), roughening treatment (mixing 100 ml of OPC-1200 EpoEtch of Okuno Chemical Industries and potassium permanganese 45 g/l aqueous solution, immersing under a temperature of 80° C. for 8 minutes, then washing with water for 1 minute) and neutralizing treatment (immersing in OPC-B303 neutralizing agent of Okuno Chemical Industries 200 ml/l aqueous solution under a temperature of 45° C. for 5 minutes, then washing with water for 1 minute) processes. Moreover, a copper layer with a thickness of 1 µm was formed with an electroless plating solution (ATS AddCopper CT, made by Okuno Chemical Industries) and heated in a furnace at 130° C. for 2 hours, and electrolytic copper plating at 1.5 ampere/dm$^2$ for 70 minutes was conducted with a copper sulfate plating solution to prepare a laminate having a copper layer with a thickness of 20 µm formed. The evaluation result is shown in Table 3.

Example 12, 13

Laminates having a copper layer with a thickness of 20 µm formed were prepared similarly as Example 11, except that the block copolymerized polyimide resins (a2, a3) obtained in Synthesis Examples 2 and 3 were used instead of the block copolymerized polyimide resin (a1) obtained in Synthesis Example 1. The evaluation result is shown in Table 3.

Example 14

A laminate having a copper layer with a thickness of 20 µm formed was prepared similarly as Example 11, except that an electrolytic copper foil (HLPLCN foil made by Nippon Mining & Metal, Rz=1.5 µm, lightness value 22, 3600 to 4000 minute projections with a height of 2 to 3 µm are located in an area of 100 µm×100 µm on a roughened surface, 14 to 20 minute projections are substantially evenly located within a range of the observation cross sectional surface of 25 µm, the minute projection has a plurality of bored portions on the lateral thereof as shown in FIG. 2) was used instead of the electrolytic copper foil (FWG-WS foil). The evaluation result is shown in Table 3.

In addition, conditions for each evaluation item are as follows.

1) Copper foil (plated copper) adhesion strength

According to JIS C6481, adhesion strength is measured to show the average value of three measurements.

2) Heat resistance test (288° C. treatment)

According to IPC-TM-650 2.4.24, the time when swelling occurred was measured with TMA2940 equipment of TA Instruments with a load of 0.005N (5 g) at a temperature increased to 288° C. by a temperature increase rate of 10° C./min and kept at 288° C. from the time when the temperature reaches 288° C. as the measurement start time. Additionally, in the case when swelling occurs at a temperature below 288° C., it is stated as minute 0. The average value of three measurements is shown.

Also, portions where swelling occurred were observed with a 500 powered microscope. The swollen portions are shown as the following representations.

Swelling between copper and the resin composition (B) is (X);

Swelling between the resin composition (B) and the B-stage resin composition layer (prepreg) is (Y);

Swelling between the B-stage resin composition layer (prepreg) and the B-stage resin composition layer (prepreg) is (Z).

3) Heat resistance under moisture absorption

A copper foil of a 50 mm×50 mm sample was removed by etching apart from half of one surface, treated with a pressure cooker test equipment (PC-3 model made by Hirayama Manufacturing) at 121° C. and 2 atmospheres for a predetermined time, and then floated for 60 seconds in a solder bath at 260° C. to visually observe the presence of abnormality in appearance change. The evaluation criteria are as follows.

○: no abnormality

X: occurrence of swelling, peeling

4) Molecular weight measurement

The number average molecular weight and the weight average molecular weight were measured using gel permeation chromatography (TOSOH HLC-8220 model equipment) in polystyrene conversion using N-methyl-2-pyrrolidon as a developing solvent.

TABLE 1

| | Example 1 | Example 2 | Example 3 | Example 4 |
|---|---|---|---|---|
| Synthesis Example 1 (a-1) | 100 | | | 100 |
| Synthesis Example 2 (a-2) | | 100 | | |
| Synthesis Example 3 (a-3) | | | 100 | |
| Name of copper foil | FWG-WS | FWG-WS | FWG-WS | HLPLCN |
| Plated copper adhesion strength after desmear treatment (kgf/cm) | 1.23 | 1.18 | 1.08 | 1.11 |
| Heat resistance (min) | 11.3 | 10.9 | 10.4 | 9.8 |
| Heat resistance evaluated swollen portion | X | X | X | X |

TABLE 1-continued

| | Example 1 | Example 2 | Example 3 | Example 4 |
|---|---|---|---|---|
| Heat resistance under moisture absorption | | | | |
| 1 hour treatment | ○○○ | ○○○ | ○○○ | ○○○ |
| 3 hour treatment | ○○○ | ○○○ | ○○○ | ○○○ |
| 5 hour treatment | ○○○ | ○○○ | ○○○ | ○○○ |

TABLE 2

| | Example 5 | Example 6 | Example 7 | Example 8 | Example 9 |
|---|---|---|---|---|---|
| Synthesis Example 1 (a-1) | 100 | | | 100 | 100 |
| Synthesis Example 2 (a-2) | | 100 | | | |
| Synthesis Example 3 (a-3) | | | 100 | | |
| BMI80 | 100 | 100 | 100 | | 100 |
| BMI | | | | 100 | |
| Name of copper foil | FWG-WS | FWG-WS | FWG-WS | FWG-WS | HLPLCN |
| Plated copper adhesion strength after desmear treatment (kgf/cm) | 1.16 | 1.15 | 1.16 | 0.98 | 1.02 |
| Heat resistance (min) | 27.6 | 25.3 | 24.8 | 15.0 | 25.7 |
| Heat resistance evaluated swollen portion | X | X | X | X | X |
| Heat resistance under moisture absorption | | | | | |
| 1 hour treatment | ○○○ | ○○○ | ○○○ | ○○○ | ○○○ |
| 3 hour treatment | ○○○ | ○○○ | ○○○ | ○○○ | ○○○ |
| 5 hour treatment | ○○○ | ○○○ | ○○○ | ○○○ | ○○○ |

TABLE 3

| | Example 10 | Example 11 | Example 12 | Example 13 | Example 14 |
|---|---|---|---|---|---|
| Synthesis Example 1 (a-1) | 100 | 100 | | | 100 |
| Synthesis Example 2 (a-2) | | | 100 | | |
| Synthesis Example 3 (a-3) | | | | 100 | |
| BMI80 | | 100 | 100 | 100 | 100 |
| C06 | 70 | 140 | 140 | 140 | 140 |
| Inorganic filler content by volume (%) | 23.1 | 20.1 | 20.1 | 20.1 | 20.1 |
| Name of copper foil | FWG-WS | FWG-WS | FWG-WS | FWG-WS | HLPLCN |
| Plated copper adhesion strength after desmear treatment (kgf/cm) | 0.89 | 0.81 | 0.82 | 0.81 | 0.79 |
| Heat resistance (min) | 43.9 | 50.8 | 53.6 | 49.2 | 44.8 |
| Heat resistance evaluated swollen portion | X | X | X | X | X |
| Heat resistance under moisture absorption | | | | | |
| 1 hour treatment | ○○○ | ○○○ | ○○○ | ○○○ | ○○○ |
| 3 hour treatment | ○○○ | ○○○ | ○○○ | ○○○ | ○○○ |
| 5 hour treatment | ○○○ | ○○○ | ○○○ | ○○○ | ○○○ |

Comparative Example 1

Figure 4:
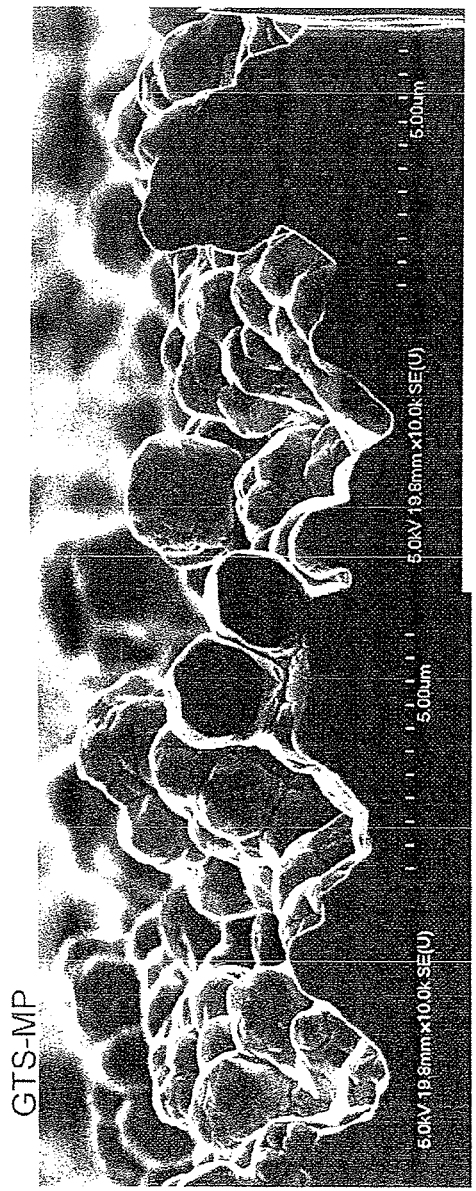
FIG. 4 is an enlarged photo showing a cross sectional surface of a conventional electrolytic copper foil.

The polyimide resin (e1) solution obtained in Comparative Synthesis Example 1 was further diluted with NMP into a block copolymerized polyimide resin solution with a solid content of 10%. The resulting resin solution was coated on a roughened surface of an electrolytic copper foil with a thickness of 12 μm (GTS-MP, made by Furukawa Electric, Rz=6.8 μm, lightness value 36, 100 to 190 minute projections with a height of 5 to 7 μm are located in an area of 100 μm×100 μm on a roughened surface, 5 to 8 minute projections are substantially evenly located within a range of the observation cross sectional surface of 25 μm, the minute projection formed on the above roughened surface of the electrolytic copper foil has no bored portion on the lateral thereof as shown in FIG. 4, the volume of pores with a pore diameter of 100 to 1000 nm formed is considerably smaller than Examples) using a reverse roll coater under the drying condition of at 120° C. for 3 minutes and at 180° C. for 3 minutes to prepare a resin composite electrolytic copper foil with a resin thickness of 2 μm. On the other hand, 400 g of 2,2-bis(4-cyanatophenyl)propane was molten at 150° C. and reacted for 4 hours while stirred, this was dissolved in methyl ethyl ketone, and 600 g of brominated bisphenol A type epoxy resin (Epiclon 1123P, made by DIC) and 0.1 part of zinc octoate were further added to prepare a varnish. This varnish was impregnated in a glass woven cloth base material with a thickness of 100 μm and dried at 150° C. for 6 minutes to prepare a B-stage resin composition layer (prepreg) with a resin content of 45%, a thickness of 105 μm and a gelation time (at 170° C.) of 120 seconds. A copper clad laminate with a thickness of 0.4 mm was prepared by arranging the above resin composition layer surface of the resin composite electrolytic copper foil opposing on the upper and the lower surfaces of four of these prepregs superimposed, and laminate molding at a temperature of 220° C., a pressure of 40 kgf/cm$^2$ and a degree of vacuum of not more than 30 mmHg for 1 hour.

The copper foil of the copper clad laminate prepared was entirely removed with a hydrogen peroxide/sulfuric acid solution, and then desmear treatment was conducted with an alkaline oxidation agent of permanganate. Moreover, a copper layer with a thickness of 1 μm was formed with an electroless plating solution (ATS AddCopper CT, made by Okuno Chemical Industries) and heated in a furnace at 130° C. for 2 hours, and then electrolytic copper plating at 1.5 ampere/dm$^2$ for 70 minutes was conducted with a copper sulfate plating solution to prepare a laminate having a copper layer with a thickness of 20 μm formed. The evaluation result is shown in Table 4.

Comparative Example 2

A laminate having a copper layer with a thickness of 20 μm formed was prepared similarly as Comparative Example 1, except the random copolymerized polyimide (e2) obtained in Comparative Synthesis Examples 2. The evaluation result is shown in Table 4.

Comparative Example 3

A laminate having a copper layer with a thickness of 20 μm formed was prepared similarly as Comparative Example 2, except that the electrolytic copper foil with a thickness of 12 μm (FWG-WS foil made by Furukawa Electric, Rz=2.0 μm, lightness value 20, 3400 to 3800 minute projections with a height of 2 to 3 μm are located in an area of 100 μm×100 μm on a roughened surface, 12 to 17 minute projections are substantially evenly located within a range of the observation cross sectional surface of 25 μm, the minute projection has a plurality of bored portions on the lateral thereof as shown in FIG. 3) was used. The evaluation result is shown in Table 4.

Comparative Example 4

The polyimide resin (e1) solution obtained in Comparative Synthesis Example 1 was further diluted with NMP into a polyimide resin solution with a solid content of 10%. To 1,000 g of this solution, 100 g of bis(4-maleimidephenyl) methane (BMI, KI Chemical Industry) and 100 g of NMP were melt mixed at 60° C. for 20 minutes to prepare a resin solution. The resulting resin solution was coated on a roughened surface of an electrolytic copper foil with a thickness of 12 μm (GTS-MP, made by Furukawa Electric, Rz=6.8 μm, lightness value 36, 100 to 190 minute projections with a height of 5 to 7 μm are located in an area of 100 μm×100 μm on a roughened surface, 5 to 8 minute projections are substantially evenly located within a range of the observation cross sectional surface of 25 μm, the minute projection formed on the above roughened surface of the electrolytic copper foil has no bored portion on the lateral thereof as shown in FIG. 4, the volume of pores with a pore diameter of 100 to 1000 nm formed is considerably smaller than Examples) using a reverse roll coater under the drying condition of at 120° C. for 3 minutes and at 180° C. for 3 minutes to prepare a resin composite electrolytic copper foil with a resin thickness of 2 μm. On the other hand, 400 g of 2,2-bis(4-cyanatophenyl)propane was molten at 150° C. and reacted for 4 hours while stirred, this was dissolved in methyl ethyl ketone, and 600 g of brominated bisphenol A type epoxy resin (Epiclon 1123P, made by DIC) and 0.1 part of zinc octoate were further added to prepare a varnish. This varnish was impregnated in a glass woven cloth base material with a thickness of 100 μm and dried at 150° C. for 6 minutes to prepare a B-stage resin composition layer (prepreg) with a resin content of 45%, a thickness of 105 μm and a gelation time (at 170° C.) of 120 seconds. A copper clad laminate with a thickness of 0.4 mm was prepared by arranging the above resin composition layer surface of the resin composite electrolytic copper foil opposing on the upper and the lower surfaces of four of these prepregs superimposed, and laminate molding at a temperature of 220° C., a pressure of 40 kgf/cm$^2$ and a degree of vacuum of not more than 30 mmHg for 1 hour.

Regarding the copper clad laminate prepared, the copper foil was entirely removed with a hydrogen peroxide/sulfuric acid solution, and then desmear treatment was conducted in swelling treatment (mixing 400 ml of OPC-B103 PreEtch of Okuno Chemical Industries and sodium hydroxide 13 g/l aqueous solution as a reagent, immersing under a temperature of 65° C. for 5 minutes, then washing with water for 1 minute), roughening treatment (mixing 100 ml of OPC-1200 EpoEtch of Okuno Chemical Industries and potassium permanganese 45 g/l aqueous solution, immersing under a temperature of 80° C. for 8 minutes, then washing with water for 1 minute) and neutralizing treatment (immersing in OPC-B303 neutralizing agent of Okuno Chemical Industries 200 ml/l aqueous solution under a temperature of 45° C. for 5 minutes, then washing with water for 1 minute) processes. Moreover, a copper layer with a thickness of 1 μm was formed with an electroless plating solution (ATS AddCopper CT, made by Okuno Chemical Industries) and heated in a furnace at 130° C. for 2 hours, and electrolytic copper plating at 1.5 ampere/dm² for 70 minutes was conducted with a copper sulfate plating solution to prepare a laminate having a copper layer with a thickness of 20 µm formed. The evaluation result is shown in Table 5.

Comparative Example 5

A laminate having a copper layer with a thickness of 20 µm formed was prepared similarly as Comparative Example 4, except the random copolymerized polyimide (e2) obtained in Comparative Synthesis Examples 2. The evaluation result is shown in Table 5.

Comparative Example 6

A laminate having a copper layer with a thickness of 20 µm formed was prepared similarly as Comparative Example 5, except 2,2-bis[4-(4-maleimidephenoxy)phenyl]propane (BMI-80, KI Chemical Industry). The evaluation result is shown in Table 5.

Comparative Example 7

A laminate having a copper layer with a thickness of 20 µm formed was prepared similarly as Comparative Example 6, except that the electrolytic copper foil with a thickness of 12 µm (FWG-WS foil made by Furukawa Electric, Rz=2.0 µm, lightness value 20, 3400 to 3800 minute projections with a height of 2 to 3 µm are located in an area of 100 µm×100 µm on a roughened surface, 12 to 17 minute projections are substantially evenly located within a range of the observation cross sectional surface of 25 µm, the minute projection has a plurality of bored portions on the lateral thereof as shown in FIG. 3) was used. The evaluation result is shown in Table 5.

Comparative Example 8

The polyimide resin (e1) solution obtained in Comparative Synthesis Example 1 was further diluted with NW into a polyimide resin solution with a solid content of 10%. To 1,000 g of this solution, 70 parts of boehmite with an average particle size of 0.6 µm (product name: C06 made by Taimei Chemicals) as the inorganic filler (b) was added, and stirred with a homomixer for 1 hour to obtain a varnish of polyimide containing an inorganic filler. The content ratio by volume of the inorganic filler in the solid content of this varnish was 23%. This varnish was coated on a roughened surface of an electrolytic copper foil with a thickness of 12 µm (GTS-MP, made by Furukawa Electric, Rz=6.8 µm, lightness value 36, 100 to 190 minute projections with a height of 5 to 7 µm are located in an area of 100 µm×100 µm on a roughened surface, 5 to 8 minute projections are substantially evenly located within a range of the observation cross sectional surface of 25 µm, the minute projection formed on the above roughened surface of the electrolytic copper foil has no bored portion on the lateral thereof as shown in FIG. 4, the volume of pores with a pore diameter of 100 to 1000 nm formed is considerably smaller than Examples) using a reverse roll coater under the drying condition of at 120° C. for 3 minutes and at 180° C. for 3 minutes to prepare a resin composite electrolytic copper foil with a resin thickness of 2 µm. On the other hand, 400 g of 2,2-bis(4-cyanatophenyl)propane was molten at 150° C. and reacted for 4 hours while stirred, this was dissolved in methyl ethyl ketone, and 600 g of brominated bisphenol A type epoxy resin (Epiclon 1123P, made by DIC) and 0.1 part of zinc octoate were further added to prepare a varnish. This varnish was impregnated in a glass woven cloth base material with a thickness of 100 µm and dried at 150° C. for 6 minutes to prepare a B-stage resin composition layer (prepreg) with a resin content of 45%, a thickness of 105 µm and a gelation time (at 170° C.) of 120 seconds. A copper clad laminate with a thickness of 0.4 mm was prepared by arranging the above resin composition layer surface of the resin composite electrolytic copper foil opposing on the upper and the lower surfaces of four of these prepregs superimposed, and laminate molding at a temperature of 220° C., a pressure of 40 kgf/cm² and a degree of vacuum of not more than 30 mmHg for 1 hour.

Regarding the copper clad laminate prepared, the copper foil was entirely removed with a hydrogen peroxide/sulfuric acid solution, and then desmear treatment was conducted in swelling treatment (mixing 400 ml of OPC-B103 PreEtch of Okuno Chemical Industries and sodium hydroxide 13 g/l aqueous solution as a reagent, immersing under a temperature of 65° C. for 5 minutes, then washing with water for 1 minute), roughening treatment (mixing 100 ml of OPC-1200 EpoEtch of Okuno Chemical Industries and potassium permanganese 45 g/l aqueous solution, immersing under a temperature of 80° C. for 8 minutes, then washing with water for 1 minute) and neutralizing treatment (immersing in OPC-B303 neutralizing agent of Okuno Chemical Industries 200 ml/l aqueous solution under a temperature of 45° C. for 5 minutes, then washing with water for 1 minute) processes. Moreover, a copper layer with a thickness of 1 am was formed with an electroless plating solution (ATS AddCopper CT, made by Okuno Chemical Industries) and heated in a furnace at 130° C. for 2 hours, and electrolytic copper plating at 1.5 ampere/dm² for 70 minutes was conducted with a copper sulfate plating solution to prepare a laminate having a copper layer with a thickness of 20 am formed. The evaluation result is shown in Table 6.

Comparative Example 9

A laminate having a copper layer with a thickness of 20 µm formed was prepared similarly as Comparative Example 8, except the random copolymerized polyimide (e2) obtained in Comparative Synthesis Examples 2. The evaluation result is shown in Table 6.

Comparative Example 10

The block copolymerized polyimide resin (a1) solution obtained in Comparative Example 1 was further diluted with NMP into a block copolymerized polyimide resin solution with a solid content of 10%. To 1,000 g of this solution, 100 g of 2,2-bis[4-(4-maleimidephenoxy)phenyl]propane (BMI-80, KI Chemical Industry) and 100 g of NMP were melt mixed at 60° C. for 20 minutes to prepare a resin solution. To the resulting resin solution, 140 parts of boehmite with an average particle size of 0.6 µm (product name: C06 made by Taimei Chemicals) as the inorganic filler (b) was further added, and stirred with a homomixer for 1 hour to obtain a varnish of block copolymerized polyimide containing an inorganic filler. The content ratio by volume of the inorganic filler in the solid content of this varnish was 20%. This varnish was coated on a roughened surface of an electrolytic copper foil with a thickness of 12 µm (GTS-MP, made by Furukawa Electric, Rz=6.8 µm, lightness value 36, 100 to 190 minute projections with a height of 5 to 7 µm are located in an area of 100 µm×100 µm on a roughened surface, 5 to 8 minute projections are substantially evenly located within a range of the observation cross sectional surface of 25 µm, the minute projection formed on the above roughened surface of the electrolytic copper foil has no bored portion on the lateral thereof as shown in FIG. 4, the volume of pores with a pore diameter of 100 to 1000 nm formed is considerably smaller than Examples) using a reverse roll coater under the drying condition of at 120° C. for 3 minutes and at 180° C. for 3 minutes to prepare a resin composite electrolytic copper foil with a resin thickness of 2 µm. On the other hand, 400 g of 2,2-bis(4-cyanatophenyl)propane was molten at 150° C. and reacted for 4 hours while stirred, this was dissolved in methyl ethyl ketone, and 600 g of brominated bisphenol A type epoxy resin (Epiclon 1123P, made by DIC) and 0.1 part of zinc octoate were further added to prepare a varnish. This varnish was impregnated in a glass woven cloth base material with a thickness of 100 µm and dried at 150° C. for 6 minutes to prepare a B-stage resin composition layer (prepreg) with a resin content of 45%, a thickness of 105 µm and a gelation time (at 170° C.) of 120 seconds. A copper clad laminate with a thickness of 0.4 mm was prepared by arranging the above resin composition layer surface of the resin composite electrolytic copper foil opposing on the upper and the lower surfaces of four of these prepregs superimposed, and laminate molding at a temperature of 220° C., a pressure of 40 kgf/cm$^2$ and a degree of vacuum of not more than 30 mmHg for 1 hour.

Regarding the copper clad laminate prepared, the copper foil was entirely removed with a hydrogen peroxide/sulfuric acid solution, and then desmear treatment was conducted in swelling treatment (mixing 400 ml of OPC-B103 PreEtch of Okuno Chemical Industries and sodium hydroxide 13 g/l aqueous solution as a reagent, immersing under a temperature of 65° C. for 5 minutes, then washing with water for 1 minute), roughening treatment (mixing 100 ml of OPC-1200 EpoEtch of Okuno Chemical Industries and potassium permanganese 45 g/l aqueous solution, immersing under a temperature of 80° C. for 8 minutes, then washing with water for 1 minute) and neutralizing treatment (immersing in OPC-B303 neutralizing agent of Okuno Chemical Industries 200 ml/l aqueous solution under a temperature of 45° C. for 5 minutes, then washing with water for 1 minute) processes. Moreover, a copper layer with a thickness of 1 µm was formed with an electroless plating solution (ATS AddCopper CT, made by Okuno Chemical Industries) and heated in a furnace at 130° C. for 2 hours, and electrolytic copper plating at 1.5 ampere/dm$^2$ for 70 minutes was conducted with a copper sulfate plating solution to prepare a laminate having a copper layer with a thickness of 20 µm formed. The evaluation result is shown in Table 6.

Comparative Example 11

A laminate having a copper layer with a thickness of 20 µm formed was prepared similarly as Comparative Example 10, except the random copolymerized polyimide (e2) obtained in Comparative Synthesis Examples 2. The evaluation result is shown in Table 6.

Comparative Example 12

A laminate having a copper layer with a thickness of 20 µm formed was prepared similarly as Comparative Example 11, except the electrolytic copper foil with a thickness of 12 µm (FWG-WS foil made by Furukawa Electric, Rz=2.0 µm, lightness value 20, 3400 to 3800 minute projections with a height of 2 to 3 µm are located in an area of 100 µm×100 µm on a roughened surface, 12 to 17 minute projections are substantially evenly located within a range of the observation cross sectional surface of 25 µm, the minute projection has a plurality of bored portions on the lateral thereof as shown in FIG. 3). The evaluation result is shown in Table 6.

Comparative Example 13

The block copolymerized polyimide resin (a1) solution obtained in Synthesis Example 1 was further diluted with NMP into a block copolymerized polyimide resin solution with a solid content of 10%. The resulting resin solution was coated on a roughened surface of an electrolytic copper foil with a thickness of 12 µm (GTS-MP, made by Furukawa Electric, Rz=6.8 µm, lightness value 36, 100 to 190 minute projections with a height of 5 to 7 µm are located in an area of 100 µm×100 µm on a roughened surface, 5 to 8 minute projections are substantially evenly located within a range of the observation cross sectional surface of 25 µm, the minute projection formed on the above roughened surface of the electrolytic copper foil has no bored portion on the lateral thereof as shown in FIG. 4, the volume of pores with a pore diameter of 100 to 1000 nm formed is considerably smaller than Examples) using a reverse roll coater under the drying condition of at 120° C. for 3 minutes and at 180° C. for 3 minutes to prepare a resin composite electrolytic copper foil with a resin thickness of 2 µm. On the other hand, 400 g of 2,2-bis(4-cyanatophenyl)propane was molten at 150° C. and reacted for 4 hours while stirred, this was dissolved in methyl ethyl ketone, and 600 g of brominated bisphenol A type epoxy resin (Epiclon 1123P, made by DIC) and 0.1 part of zinc octoate were further added to prepare a varnish. This varnish was impregnated in a glass woven cloth base material with a thickness of 100 µm and dried at 150° C. for 6 minutes to prepare a B-stage resin composition layer (prepreg) with a resin content of 45%, a thickness of 105 µm and a gelation time (at 170° C.) of 120 seconds. A copper clad laminate with a thickness of 0.4 mm was prepared by arranging the above resin composition layer surface of the resin composite electrolytic copper foil opposing on the upper and the lower surfaces of four of these prepregs superimposed, and laminate molding at a temperature of 220° C., a pressure of 40 kgf/cm$^2$ and a degree of vacuum of not more than 30 mmHg for 1 hour.

Regarding the copper clad laminate prepared, the copper foil was entirely removed with a hydrogen peroxide/sulfuric acid solution, and then desmear treatment was conducted in swelling treatment (mixing 400 ml of OPC-B103 PreEtch of Okuno Chemical Industries and sodium hydroxide 13 g/l aqueous solution as a reagent, immersing under a temperature of 65° C. for 5 minutes, then washing with water for 1 minute), roughening treatment (mixing 100 ml of OPC-1200 EpoEtch of Okuno Chemical Industries and potassium permanganese 45 g/l aqueous solution, immersing under a temperature of 80° C. for 8 minutes, then washing with water for 1 minute) and neutralizing treatment (immersing in OPC-B303 neutralizing agent of Okuno Chemical Industries 200 ml/l aqueous solution under a temperature of 45° C. for 5 minutes, then washing with water for 1 minute) processes. Moreover, a copper layer with a thickness of 1 µm was formed with an electroless plating solution (ATS AddCopper CT, made by Okuno Chemical Industries) and heated in a furnace at 130° C. for 2 hours, and electrolytic copper plating at 1.5 ampere/dm$^2$ for 70 minutes was conducted with a copper sulfate plating solution to prepare a laminate having a copper layer with a thickness of 20 µm formed. The evaluation result is shown in Table 7.

Comparative Example 14

The block copolymerized polyimide resin (a1) solution obtained in Synthesis Example 1 was further diluted with NMP into a block copolymerized polyimide resin solution with a solid content of 10%. To 1,000 g of this solution, 100 g of 2,2-bis[4-(4-maleimidephenoxy)phenyl]propane (BMI-80, KI Chemical Industry) and 100 g of NMP were melt mixed at 60° C. for 20 minutes to prepare a resin solution. The resulting resin solution was coated on a roughened surface of an electrolytic copper foil with a thickness of 12 µm (GTS-MP, made by Furukawa Electric, Rz 6.8 µm, lightness value 36, 100 to 190 minute projections with a height of 5 to 7 µm are located in an area of 100 µm×100 µm on a roughened surface, 5 to 8 minute projections are substantially evenly located within a range of the observation cross sectional surface of 25 µm, the minute projection formed on the above roughened surface of the electrolytic copper foil has no bored portion on the lateral thereof as shown in FIG. 4, the volume of pores with a pore diameter of 100 to 1000 nm formed is considerably smaller than Examples) using a reverse roll coater under the drying condition of at 120° C. for 3 minutes and at 180° C. for 3 minutes to prepare a resin composite electrolytic copper foil with a resin thickness of 2 µm. On the other hand, 400 g of 2,2-bis(4-cyanatophenyl)propane was molten at 150° C. and reacted for 4 hours while stirred, this was dissolved in methyl ethyl ketone, and 600 g of brominated bisphenol A type epoxy resin (Epiclon 1123P, made by DIC) and 0.1 part of zinc octoate were further added to prepare a varnish. This varnish was impregnated in a glass woven cloth base material with a thickness of 100 µm and dried at 150° C. for 6 minutes to prepare a B-stage resin composition layer (prepreg) with a resin content of 45%, a thickness of 105 µm and a gelation time (at 170° C.) of 120 seconds. A copper clad laminate with a thickness of 0.4 mm was prepared by arranging the above resin composition layer surface of the resin composite electrolytic copper foil opposing on the upper and the lower surfaces of four of these prepregs superimposed, and laminate molding at a temperature of 220° C., a pressure of 40 kgf/cm² and a degree of vacuum of not more than 30 mmHg for 1 hour.

Regarding the copper clad laminate prepared, the copper foil was entirely removed with a hydrogen peroxide/sulfuric acid solution, and then desmear treatment was conducted in swelling treatment (mixing 400 ml of OPC-B103 Preach of Okuno Chemical Industries and sodium hydroxide 13 g/l aqueous solution as a reagent, immersing under a temperature of 65° C. for 5 minutes, then washing with water for 1 minute), roughening treatment (mixing 100 ml of OPC-1200 EpoEtch of Okuno Chemical Industries and potassium permanganese 45 g/l aqueous solution, immersing under a temperature of 80° C. for 8 minutes, then washing with water for 1 minute) and neutralizing treatment (immersing in OPC-B303 neutralizing agent of Okuno Chemical Industries 200 ml/l aqueous solution under a temperature of 45° C. for 5 minutes, then washing with water for 1 minute) processes. Moreover, a copper layer with a thickness of 1 µm was formed with an electroless plating solution (ATS AddCopper CT, made by Okuno Chemical Industries) and heated in a furnace at 130° C. for 2 hours, and electrolytic copper plating at 1.5 ampere/dm² for 70 minutes was conducted with a copper sulfate plating solution to prepare a laminate having a copper layer with a thickness of 20 µm formed. The evaluation result is shown in Table 7.

Comparative Example 15

The block copolymerized polyimide resin (a1) solution obtained in Synthesis Example 1 was further diluted with NMP into a block copolymerized polyimide resin solution with a solid content of 10%. To 1,000 g of this solution, 100 g of 2,2-bis[4-(4-maleimidephenoxy)phenyl]propane (EMI-80, KI Chemical Industry) and 100 g of NMP were melt mixed at 60° C. for 20 minutes to prepare a resin solution. To the resulting resin solution, 140 parts of boehmite with an average particle size of 0.6 µm (product name: C06 made by Taimei Chemicals) as the inorganic filler (b) was further added, and stirred with a homomixer for 1 hour to obtain a varnish of block copolymerized polyimide containing an inorganic filler. The content ratio by volume of the inorganic filler in the solid content of this varnish was 20%. This varnish was coated on a roughened surface of an electrolytic copper foil with a thickness of 12 µm (GTS-MP, made by Furukawa Electric, Rz=6.8 µm, lightness value 36, 100 to 190 minute projections with a height of 5 to 7 µm are located in an area of 100 µm×100 µm on a roughened surface, 5 to 8 minute projections are substantially evenly located within a range of the observation cross sectional surface of 25 µm, the minute projection formed on the above roughened surface of the electrolytic copper foil has no bored portion on the lateral thereof as shown in FIG. 4, the volume of pores with a pore diameter of 100 to 1000 nm formed is considerably smaller than Examples) using a reverse roll coater under the drying condition of at 120° C. for 3 minutes and at 180° C. for 3 minutes to prepare a resin composite electrolytic copper foil with a resin thickness of 2 µm. On the other hand, 400 g of 2,2-bis(4-cyanatophenyl)propane was molten at 150° C. and reacted for 4 hours while stirred, this was dissolved in methyl ethyl ketone, and 600 g of brominated bisphenol A type epoxy resin (Epiclon 1123P, made by DIC) and 0.1 part of zinc octoate were further added to prepare a varnish. This varnish was impregnated in a glass woven cloth base material with a thickness of 100 µm and dried at 150° C. for 6 minutes to prepare a B-stage resin composition layer (prepreg) with a resin content of 45%, a thickness of 105 µm and a gelation time (at 170° C.) of 120 seconds. A copper clad laminate with a thickness of 0.4 mm was prepared by arranging the above resin composition layer surface of the resin composite electrolytic copper foil opposing on the upper and the lower surfaces of four of these prepregs superimposed, and laminate molding at a temperature of 220° C., a pressure of 40 kgf/cm² and a degree of vacuum of not more than 30 mmHg for 1 hour.

Regarding the copper clad laminate prepared, the copper foil was entirely removed with a hydrogen peroxide/sulfuric acid solution, and then desmear treatment was conducted in swelling treatment (mixing 400 ml of OPC-B103 PreEtch of Okuno Chemical Industries and sodium hydroxide 13 g/l aqueous solution as a reagent, immersing under a temperature of 65° C. for 5 minutes, then washing with water for 1 minute), roughening treatment (mixing 100 ml of OPC-1200 EpoEtch of Okuno Chemical Industries and potassium permanganese 45 g/l aqueous solution, immersing under a temperature of 80° C. for 8 minutes, then washing with water for 1 minute) and neutralizing treatment (immersing in OPC-B303 neutralizing agent of Okuno Chemical Industries 200 ml/l aqueous solution under a temperature of 45° C. for 5 minutes, then washing with water for 1 minute) processes. Moreover, a copper layer with a thickness of 1 µm was formed with an electroless plating solution (ATS AddCopper CT, made by Okuno Chemical Industries) and heated in a furnace at 130° C. for 2 hours, and electrolytic copper plating at 1.5 ampere/dm$^2$ for 70 minutes was conducted with a copper sulfate plating solution to prepare a laminate having a copper layer with a thickness of 20 μm formed. The evaluation result is shown in Table 7.

TABLE 4

|  | Comparative Example 1 | Comparative Example 2 | Comparative Example 3 |
|---|---|---|---|
| Comparative Synthesis Example 1 (e-1) | 100 | | |
| Comparative Synthesis Example 2 (e-2) | | 100 | 100 |
| Name of copper foil | GTS-MP | GTS-MP | FWG-WS |
| Plated copper adhesion strength after desmear treatment (kgf/cm) | 0.19 | 0.43 | 1.05 |
| Heat resistance (min) | 0 | 0 | 0 |
| Heat resistance evaluated swollen portion | X | X | X |
| Heat resistance tinder moisture absorption | | | |
| 1 hour treatment | xxx | xxx | ooo |
| 3 hour treatment | xxx | xxx | xxx |
| 5 hour treatment | xxx | xxx | xxx |

TABLE 5

|  | Comparative Example 4 | Comparative Example 5 | Comparative Example 6 | Comparative Example 7 |
|---|---|---|---|---|
| Comparative Synthesis Example 1 (e-1) | 100 | | | |
| Comparative Synthesis Example 2 (e-2) | | 100 | 100 | 100 |
| BMI80 | | | 100 | 100 |
| BMI | 100 | 100 | | |
| Name of copper foil | GTS-MP | GTS-MP | GTS-MP | FWG-WS |
| Plated copper adhesion strength after desmear treatment (kgf/cm) | 0.16 | 0.44 | 0.42 | 0.96 |
| Heat resistance (min) | 0 | 0 | 2.9 | 3.8 |
| Heat resistance evaluated swollen portion | X | X | X | X |
| Heat resistance under moisture absorption | | | | |
| 1 hour treatment | xxx | xxx | xxx | ooo |
| 3 hour treatment | xxx | xxx | xxx | ooo |
| 5 hour treatment | xxx | xxx | xxx | oxx |

TABLE 6

|  | Comparative Example 8 | Comparative Example 9 | Comparative Example 10 | Comparative Example 11 | Comparative Example 12 |
|---|---|---|---|---|---|
| Comparative Synthesis Example 1 (a-1) | 100 | | 100 | | |
| Comparative Synthesis Example 2 (a-2) | | 100 | | 100 | 100 |
| BMI80 | | | 100 | 100 | 100 |
| C06 | 70 | 70 | 140 | 140 | 140 |
| Inorganic filler content by volume (%) | 23.1 | 23.1 | 20.1 | 20.1 | 20.1 |
| Name of copper foil | GTS-MP | GTS-MP | GTS-MP | GTS-MP | FWG-WS |
| Plated copper adhesion strength after desmear treatment (kgf/cm) | 0.14 | 0.36 | 0.18 | 0.33 | 0.80 |
| Heat resistance (min) | 0 | 0 | 1.3 | 3.3 | 3.9 |
| Heat resistance evaluated swollen portion | X | X | X | X | X |
| Heat resistance under moisture absorption | | | | | |
| 1 hour treatment | xxx | xxx | xxx | xxx | ooo |
| 3 hour treatment | xxx | xxx | xxx | xxx | ooo |
| 5 hour treatment | xxx | xxx | xxx | xxx | oxx |

TABLE 7

|  | Comparative Example 13 | Comparative Example 14 | Comparative Example 15 |
|---|---|---|---|
| Synthesis Example 1 (a-1) | 100 | 100 | 100 |
| BMI80 |  | 100 | 100 |
| C06 |  |  | 140 |
| Inorganic filler content by volume (%) |  |  | 20.1 |
| Name of copper foil | GTS-MP | GTS-MP | GTS-MP |
| Plated copper adhesion strength after desmear treatment (kgf/cm) | 0.32 | 0.31 | 0.37 |
| Heat resistance (min) | 0 | 0 | 0 |
| Heat resistance evaluated swollen portion | X | X | X |
| Heat resistance under moisture absorption |  |  |  |
| 1 hour treatment | xxx | ooo | ooo |
| 3 hour treatment | xxx | oxx | oxx |
| 5 hour treatment | xxx | xxx | xxx |

As apparent from Examples and Comparative Examples, by using a resin composite electrolytic copper foil having a block copolymerized polyimide resin (a) with a structure that an imide oligomer of a first structural unit bonded to the end of an imide oligomer of a second structural unit and an imide oligomer of the second structural unit bonded to the end of an imide oligomer of the first structural unit are alternately repeated, a resin comprising the block copolymerized polyimide resin (a) and a maleimide compound, or compositions thereof containing an inorganic filler formed on a roughened surface side of an electrolytic copper foil (A) having a surface roughness Rz of 1.0 to 3.0 μm, a lightness value of not more than 30 and many (200 to 25000) minute projections with a height of 1 to 3 μm formed by the above roughening particles located in an area of 100 μm×100 μm, copper foil adherence strength and plate adherence strength remarkably improved, and good adherence strength could be ensured without decreasing the adherence strength of plated copper after desmear treatment. Moreover, it is clear that heat resistance improved by containing an inorganic filler.

What is claimed is:

1. A resin composite electrolytic copper foil prepared by forming a roughened surface having a plurality of minute projections, a surface roughness (Rz) within a range of 1.0 μm to 3.0 μm and a lightness value of not more than 30 on one surface of an electrolytic copper foil (A), and forming a layer of a resin composition (B) containing a block copolymerized polyimide resin (a) having a structure wherein imide oligomers of a first structural unit and a second structural unit are bonded alternately and repeatedly on the roughened surface, wherein a measurement method of the lightness value is a method of irradiating a measurement sample surface and measuring a light reflection amount to be represented as a lightness value, wherein the plurality of minute projections include minute projections comprising a plurality of bored portions, and the minute projections are located by 200 to 25000 in an area of 100 μm×100 μm, the roughened surface includes pores having a pore diameter of 100 to 1000 nm, and the volume of pores with a pore diameter of 100 to 1000 nm is not less than 0.1 mL/m$^2$ when measured with a Shimadzu Autopore III 9400 series apparatus, the block copolymerized polyimide resin (a) is a block copolymerized polyimide resin (a) having a block of the general formula (1) as a structural unit and a block of the general formula (2) as a structural unit,

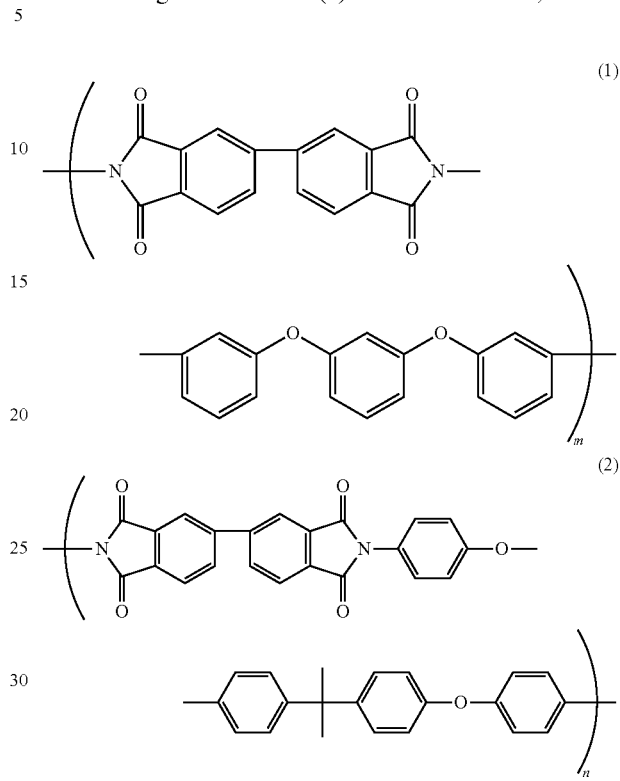

in the formulae, m and n are each not less than 2, and m:n=1:9 to 3:1, and the resin composition (B) contains an inorganic filler (b).

2. A resin composite electrolytic copper foil according to claim 1, wherein the weight average molecular weights of the first and the second structural units in the block copolymerized polyimide resin (a) are each independently 5000 to 30000.

3. A resin composite electrolytic copper foil according to claim 1, wherein the resin composition (B) contains the inorganic filler (b) within a range of 5 to 50% by volume based on total 100% by volume of the block copolymerized polyimide resin (a) and the inorganic filler (b).

4. A resin composite electrolytic copper foil according to claim 1, wherein the resin composition (B) contains a maleimide compound (c).

5. A resin composite electrolytic copper foil according to claim 4, wherein in the resin composition (B), the content of the block copolymerized polyimide resin (a) and the maleimide compound (c) is 1:9 to 9:1 in the weight ratio.

6. A resin composite electrolytic copper foil according to claim 4, wherein the maleimide compound (c) is 2,2-bis[4-(4-maleimidephenoxy)phenyl]propane.

7. A resin composite electrolytic copper foil according to claim 1, wherein the thickness of the layer of the resin composition (B) is 1 μm to 10 μm.

8. A copper clad laminate prepared by layer laminating a resin composite electrolytic copper foil according to claim 1 and a B-stage resin composition.

9. A copper clad laminate according to claim 8, wherein the B-stage resin composition layer contains a resin and an inorganic filler, and contains the inorganic filler within a range of 5 to 50% by volume based on total 100% by volume of the resin and the inorganic filler.

10. A copper clad laminate prepared by forming a copper layer with plating on a surface of a copper clad laminate according to claim 8 where copper is entirely removed.

11. A printed wiring board using a copper clad laminate according to claim 8.

12. A copper clad laminate prepared by layer laminating a resin composite electrolytic copper foil according to claim 2 and a B-stage resin composition.

13. A copper clad laminate prepared by layer laminating a resin composite electrolytic copper foil according to claim 3 and a B-stage resin composition.

14. A copper clad laminate prepared by layer laminating a resin composite electrolytic copper foil according to claim 4 and a B-stage resin composition.

15. A copper clad laminate prepared by layer laminating a resin composite electrolytic copper foil according to claim 5 and a B-stage resin composition.

16. A copper clad laminate prepared by layer laminating a resin composite electrolytic copper foil according to claim 6 and a B-stage resin composition.

17. A copper clad laminate prepared by layer laminating a resin composite electrolytic copper foil according to claim 7 and a B-stage resin composition.

18. A copper clad laminate according to claim 12, wherein the B-stage resin composition layer contains a resin and an inorganic filler, and contains the inorganic filler within a range of 5 to 50% by volume based on total 100% by volume of the resin and the inorganic filler.

19. A copper clad laminate according to claim 13, wherein the B-stage resin composition layer contains a resin and an inorganic filler, and contains the inorganic filler within a range of 5 to 50% by volume based on total 100% by volume of the resin and the inorganic filler.

20. A copper clad laminate according to claim 14, wherein the B-stage resin composition layer contains a resin and an inorganic filler, and contains the inorganic filler within a range of 5 to 50% by volume based on total 100% by volume of the resin and the inorganic filler.

* * * * *